(12) United States Patent
Kang et al.

(10) Patent No.: US 10,868,073 B2
(45) Date of Patent: Dec. 15, 2020

(54) METHOD OF FABRICATING SEMICONDUCTOR PACKAGE

(71) Applicant: Samsung Electronics Co., Ltd., Suwon-si (KR)

(72) Inventors: Un-Byoung Kang, Hwaseong-si (KR); Yungcheol Kong, Cheonan-si (KR); Hyunsu Jun, Seongnam-si (KR); Kyoungsei Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/177,780

(22) Filed: Nov. 1, 2018

(65) Prior Publication Data

US 2019/0074316 A1    Mar. 7, 2019

Related U.S. Application Data

(62) Division of application No. 15/583,224, filed on May 1, 2017, now Pat. No. 10,177,188.

(30) Foreign Application Priority Data

Aug. 4, 2016   (KR) .................. 10-2016-0099532

(51) Int. Cl.
*H01L 27/146*   (2006.01)
*H01L 31/0203*   (2014.01)
(Continued)

(52) U.S. Cl.
CPC ........ *H01L 27/14634* (2013.01); *H01L 24/48* (2013.01); *H01L 27/1469* (2013.01); *H01L 27/14618* (2013.01); *H01L 27/14621* (2013.01); *H01L 27/14627* (2013.01); *H01L 27/14636* (2013.01); *H01L 27/14645* (2013.01);
(Continued)

(58) Field of Classification Search
CPC ........... H01L 27/14634; H01L 27/1469; H01L 27/14618; H01L 27/14621; H01L 27/14627; H01L 27/14636; H01L 27/14645; H01L 24/48; H01L 31/0203; H01L 2224/16227
See application file for complete search history.

(56) References Cited

U.S. PATENT DOCUMENTS 7,701,044 B2    4/2010   Kang et al.
7,884,407 B2    2/2011   Nagano et al.
(Continued)

FOREIGN PATENT DOCUMENTS

CN    105655305 A    6/2016
JP    2013-183425 A    9/2013
(Continued)

OTHER PUBLICATIONS

US 9,190,444 B2, 04/2015, Solhusvik et al. (withdrawn)

*Primary Examiner* — Feifei Yeung Lopez
(74) *Attorney, Agent, or Firm* — Harness, Dickey & Pierce, P.L.C.

(57) ABSTRACT

A semiconductor package including a substrate, a memory chip on the substrate, a mold layer on the substrate to cover a side surface of the memory chip, an image sensor chip on the memory chip and the mold layer, and a connection terminal between and electrically connecting the memory chip to the image sensor chip may be provided.

18 Claims, 31 Drawing Sheets

(51) Int. Cl.
    *H01L 23/00*     (2006.01)
    *H01L 31/024*    (2014.01)
(52) U.S. Cl.
    CPC ........ *H01L 31/0203* (2013.01); *H01L 31/024*
        (2013.01); *H01L 2224/16227* (2013.01); *H01L*
        *2924/00014* (2013.01)

(56)         References Cited

U.S. PATENT DOCUMENTS

| | | | |
|---|---|---|---|
| 8,669,179 | B2 | 3/2014 | Akram et al. |
| 8,773,562 | B1 | 7/2014 | Fan |
| 8,791,536 | B2 | 7/2014 | Kinsman et al. |
| 8,853,754 | B2 | 10/2014 | Lin et al. |
| 8,946,610 | B2 | 2/2015 | Iwabuchi et al. |
| 8,957,358 | B2 | 2/2015 | Wan et al. |
| 9,299,732 | B2 | 3/2016 | Webster et al. |
| 9,324,755 | B2 | 4/2016 | Borthakur et al. |
| 9,350,928 | B2 | 5/2016 | Keelan et al. |
| 9,362,325 | B2 | 6/2016 | Baba et al. |
| 9,653,397 | B2 | 5/2017 | Kwon et al. |
| 9,911,828 | B2 | 3/2018 | Kim et al. |
| 2002/0003167 | A1 | 1/2002 | Cheng |
| 2006/0091290 | A1* | 5/2006 | Yoshihara ......... H01L 27/14618 250/208.1 |
| 2006/0091487 | A1* | 5/2006 | Hanada .................. H01L 24/03 257/432 |
| 2007/0132111 | A1* | 6/2007 | Lien ........................ H01L 21/56 257/787 |
| 2008/0042046 | A1* | 2/2008 | Mabuchi ........... H01L 27/14634 250/208.1 |
| 2008/0093721 | A1* | 4/2008 | Kang ................ H01L 27/14618 257/680 |
| 2012/0228681 | A1 | 9/2012 | Lin et al. |
| 2013/0033632 | A1* | 2/2013 | Kishi ................ H01L 27/14634 348/308 |
| 2014/0055654 | A1* | 2/2014 | Borthakur ............. H04N 5/335 348/302 |
| 2014/0264508 | A1 | 9/2014 | Kao et al. |
| 2015/0076640 | A1 | 3/2015 | Iwafuchi et al. |
| 2015/0163403 | A1 | 6/2015 | Wakabayashi |
| 2015/0189214 | A1 | 7/2015 | Kurose |
| 2015/0270307 | A1 | 9/2015 | Umebayashi et al. |
| 2016/0079219 | A1 | 3/2016 | Hosomi |
| 2016/0086997 | A1 | 3/2016 | Okamoto |
| 2016/0155680 | A1 | 6/2016 | Stueckjuergen et al. |
| 2016/0181226 | A1 | 6/2016 | Wan |
| 2016/0300962 | A1* | 10/2016 | Borthakur .......... H01L 27/14621 |
| 2018/0138225 | A1 | 5/2018 | Kim et al. |

FOREIGN PATENT DOCUMENTS

| | | |
|---|---|---|
| JP | 2016058627 A | 4/2016 |
| KR | 10-2015-0076065 A | 7/2015 |
| KR | 10-1545951 B1 | 8/2015 |
| TW | 201624616 A | 7/2016 |
| TW | 201628062 A | 8/2016 |

* cited by examiner

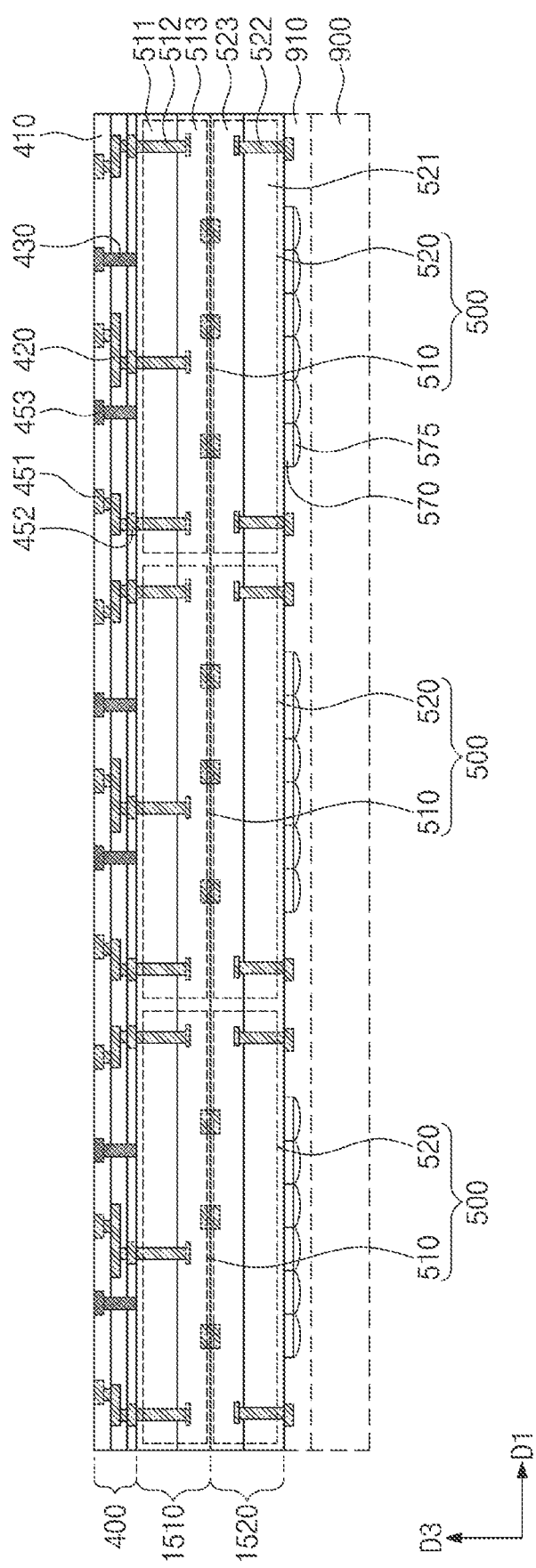

METHOD OF FABRICATING SEMICONDUCTOR PACKAGE

CROSS-REFERENCE TO RELATED APPLICATIONS

This U.S. non-provisional patent application is a divisional of U.S. application Ser. No. 15/583,224, filed on May 1, 2017, which claims priority under 35 U.S.C. § 119 to Korean Patent Application No. 10-2016-0099532, filed on Aug. 4, 2016, in the Korean Intellectual Property Office, the entire contents of each of which are hereby incorporated by reference.

BACKGROUND

The present disclosure relates to semiconductor packages and/or methods of fabricating the same, and in particular, to stacked-type semiconductor packages including a CMOS sensor.

An image sensor is an electronic device configured to convert optical data, in which one- or two-dimensional image information is contained, into electric signals. The image sensor is generally classified into a complementary metal-oxide semiconductor (CMOS) image sensor and a charge-coupled device (CCD) image sensor. The image sensor can be used for cameras, camcorders, multimedia personal computers, and/or security cameras, and demands for the image sensor are rapidly increasing.

In the semiconductor industry, various package technologies have been developed to meet demands for larger capacity, thinner thickness, and smaller size of semiconductor devices and/or electronic products.

SUMMARY

Some example embodiments of the inventive concepts provide semiconductor packages with a high signal transmission speed and a reduced image distortion property.

Some example embodiments of the inventive concepts provide methods of fabricating a semiconductor package with a high yield.

According to an example embodiment of the inventive concepts, a semiconductor package may include a substrate, a memory chip on the substrate, a mold layer on the substrate, the mold layer covering a side surface of the memory chip, an image sensor chip on the memory chip and the mold layer, and a connection terminal provided between the memory chip and the image sensor chip, the connection terminal electrically connecting the memory chip to the image sensor chip.

According to an example embodiment of the inventive concepts, a semiconductor package may include an image sensor chip having a first surface and a second surface facing each other and including a circuit layer and a conductive portion, the conductive portion electrically connected to the circuit layer, and the conductive portion between the circuit layer and the first surface of the image sensor chip, a memory chip on the first surface of the image sensor chip, the memory chip having a width less than that of the image sensor chip, a chip pad on a surface of the memory chip, the chip pad electrically connected to the conductive portion, and a mold layer on the first surface of the image sensor chip, the mold layer covering a side surface of the memory chip.

According to an example embodiment of the inventive concepts, a method of fabricating a semiconductor package may include preparing an image sensor chip having a first surface and a second surface facing each other, the image sensor chip including pixel regions positioned on the second surface of the image sensor chip, mounting a memory chip on the first surface of the image sensor chip such that the memory chip is electrically connected to the image sensor chip through a connection terminal formed between the first surface of the image sensor chip and the memory chip, and forming a mold layer on the first surface of the image sensor chip to cover a side surface of the memory chip and to form a chip stack.

According to an example embodiment of the inventive concepts, a semiconductor package may include a substrate, a memory chip on the substrate, an image sensor chip on the memory chip, and a connection terminal between the memory chip and the image sensor chip, the connection terminal electrically connecting the memory chip to the image sensor chip. The image sensor chip may have a width less than that of the memory chip.

According to an example embodiment of the inventive concepts, a semiconductor package may include a substrate, a memory chip on the substrate, an image sensor chip on the memory chip, the image sensor chip including a first surface facing the memory chip and a second surface having pixels thereon, and at least one connection terminal between the memory chip and the image sensor chip, the connection terminal electrically connecting a circuit of the memory chip to a circuit of the image sensor chip.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 12A to 12E are sectional views illustrating a method of fabricating a semiconductor package, according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Semiconductor packages and/or methods of fabricating the same according to some example embodiments of the inventive concepts will be described.

Figure 1A:
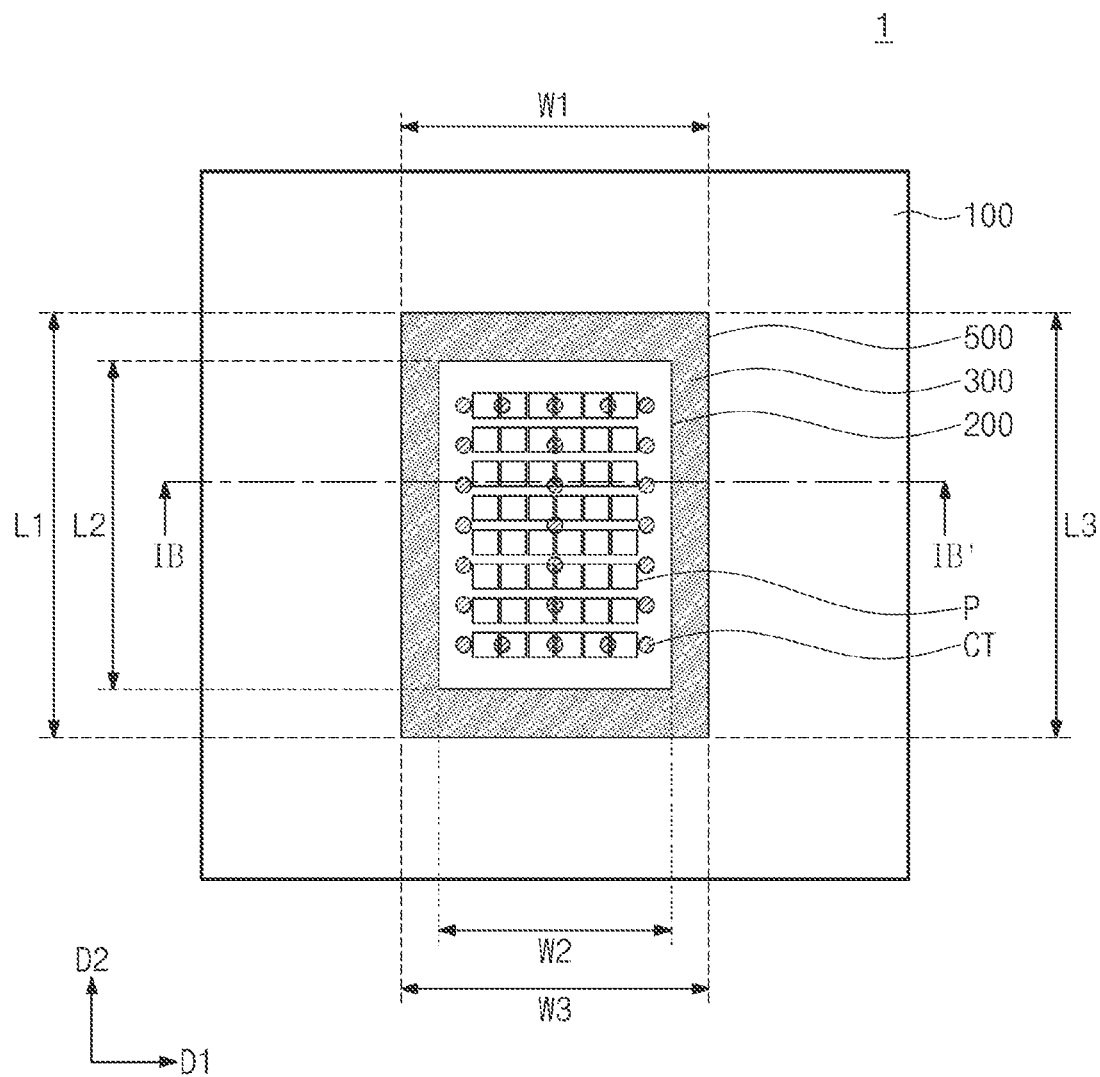
FIG. 1A is a plan view illustrating a semiconductor package according to an example embodiment of the inventive concepts.
Figure 1B:
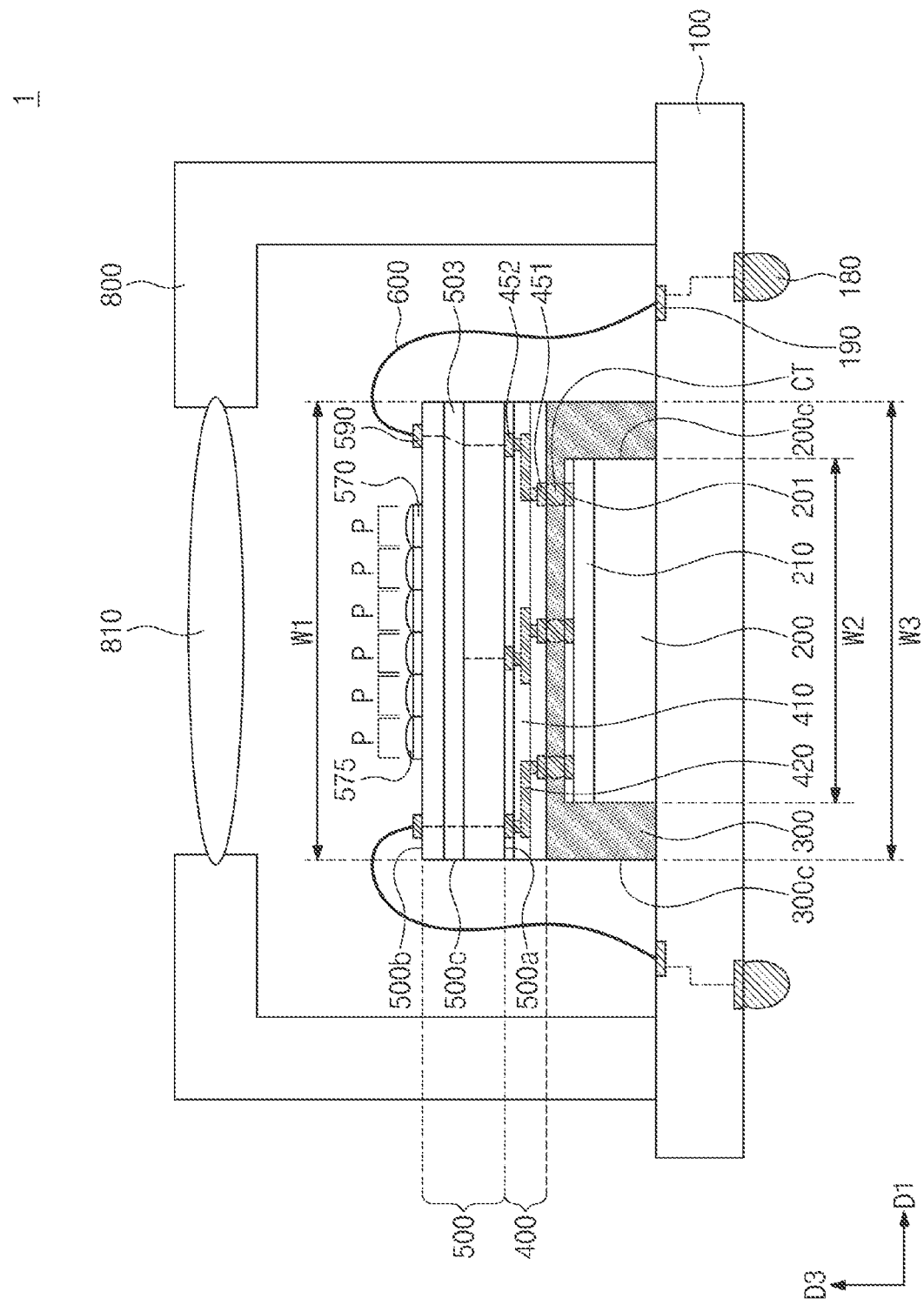
FIG. 1B is a sectional view taken along line IB-IB' of FIG. 1A.

FIG. 1A is a plan view illustrating a semiconductor package according to an example embodiment of the inventive concepts. FIG. 1B is a sectional view taken along line IB-IB' of FIG. 1A.

Referring to FIGS. 1A and 1B, a semiconductor package 1 may include a substrate 100, a memory chip 200, a mold layer 300, a connection terminal CT, a re-distribution layer 400, and an image sensor chip 500. The substrate 100 may be, for example, a printed circuit board (PCB). In some example embodiments, the substrate 100 may be flexible. A substrate pad 190 may be provided on a top surface of the substrate 100. An outer terminal 180 may be provided on a bottom surface of the substrate 100. The outer terminal 180 may be provided in the form of a solder ball. The outer terminal 180 and the substrate pad 190 may be formed of or include a conductive material. The outer terminal 180 may be electrically connected to the substrate pad 190 via the substrate 100, as depicted by a dotted line. In the present specification, the expression of "an element is electrically connected to another element" means that two elements are directly or indirectly connected to each other.

The memory chip 200 may be provided on the substrate 100. The memory chip 200 may be or include, for example, a dynamic random access memory (DRAM) chip, a static RAM (SRAM) chip, a magnetic RAM (MRAM) chip, or a FLASH memory chip. The memory chip 200 may be formed of or include a silicon-containing material. A top surface of the memory chip 200 may serve as an active surface. The memory chip 200 may include a circuit pattern layer 210 and a chip pad 201. The chip pad 201 may be provided on the top surface of the memory chip 200 and may be electrically connected to integrated devices (not shown) in the circuit pattern layer 210. Hereinafter, in the present specification, an expression of "an element is electrically connected to a circuit pattern layer or a circuit layer" means that the element is electrically connected to integrated devices or integrated circuits, which are provided in the circuit pattern layer or the circuit layer. In addition, an expression of "an element is electrically connected to the memory chip 200" means that the element is electrically connected to integrated devices or integrated circuits provided in the memory chip 200. The chip pad 201 may be formed of or include a metal (e.g., aluminum). An adhesive layer (not shown) may be interposed between the substrate 100 and the memory chip 200.

The mold layer 300 may be provided on the top surface of the substrate 100. The mold layer 300 may cover a side surface 200c of the memory chip 200. The mold layer 300 may not cover a bottom surface of the memory chip 200. The mold layer 300 may mitigate or prevent the memory chip 200 from being damaged by external factors (e.g., mechanical impact or moisture). The mold layer 300 may be formed of or include an insulating polymer (e.g., epoxy molding compound). The mold layer 300 may have thermal conductivity that is lower than those of the substrate 100 and the memory chip 200. For example, the mold layer 300 may have thermal conductivity of about 0.88 W/mK. In the case where the bottom surface of the memory chip 200 is not covered with the mold layer 300, heat generated from the memory chip 200 during operations of the semiconductor package 1 may be more efficiently exhausted to the outside through the substrate 100.

The image sensor chip 500 may be provided on the memory chip 200 and the mold layer 300. As shown in FIG. 1A, the image sensor chip 500 may have a size that is different from that of the memory chip 200. When viewed in a plan view, the size of the image sensor chip 500 may be larger than that of the memory chip 200. In the present specification, the size of an element may be represented in terms of a width or a length. The width of the element may be a pattern size of the element that is measured in a first direction D1, and the length of the element may be a pattern size of the element that is measured in a second direction D2. Here, the first direction D1 and the second direction D2 may be parallel to the top surface of the substrate 100. The second direction D2 may not be parallel to the first direction D1. A width W1 of the image sensor chip 500 may be larger than a width W2 of the memory chip 200. A length L1 of the image sensor chip 500 may be larger than a length L2 of the memory chip 200. The width W1 and the length L1 of the image sensor chip 500 may be substantially equal to a width W3 and a length L3, respectively, of the mold layer 300. In the present specification, the equality in terms of length or width means that a difference between two lengths or between two widths is within a given process tolerance. As shown in FIG. 1B, a side surface 500c of the image sensor chip 500 may be coplanar with a side surface 300c of the mold layer 300. The mold layer 300 may be interposed between the substrate 100 and the image sensor chip 500, and may be used to support the image sensor chip 500.

Accordingly, the image sensor chip 500 can be stably disposed on the memory chip 200 and the mold layer 300.

The image sensor chip 500 may have a first surface 500a and a second surface 500b facing each other. The first surface 500a of the image sensor chip 500 may be a front surface, and the second surface 500b may be a back surface. The image sensor chip 500 may be provided in such a way that the first surface 500a faces the memory chip 200. In this case, light may be incident into the image sensor chip 500 through the second surface 500b. The image sensor chip 500 may include pixels P provided on the second surface 500b. The pixels P may be provided at a center region of the image sensor chip 500, when viewed in a plan view. The image sensor chip 500 may be configured to convert optical signals obtained from an object (e.g., a subject) into electrical signals. Color filters 570 and micro lens arrays 575 may be provided on the second surface 500b of the image sensor chip 500, and may be provided on the pixels P, respectively. A connection pad 590 of the image sensor chip 500 may be provided on an edge region of the second surface 500b of the image sensor chip 500 and may be spaced apart from the pixels P. A bonding wire 600 may be coupled to the connection pad 590 and the substrate pad 190. The image sensor chip 500 may be electrically connected to the substrate 100 through the bonding wire 600.

A circuit layer 503 may be provided in the image sensor chip 500 and may include integrated circuits (not shown). The number and arrangements of the circuit layer 503 are not limited to the illustrated example and are variously changed. Electrical signals output from the integrated circuits of the circuit layer 503 may be transmitted to the substrate 100 through the bonding wire 600, as depicted by the dotted line. Further, electrical signals to be input from the outside may be transmitted to the integrated circuits of the circuit layer 503 through the substrate 100 and the bonding wire 600. In FIG. 1B, the dotted line in the image sensor chip 500 illustrates the electric connection schematically. A second pad 452 may be provided on the first surface 500a of the image sensor chip 500 and may be electrically connected to the circuit layer 503 or the connection pad 590, as depicted by a dotted line. For example, the second pad 452 may be electrically connected to integrated circuits of the circuit layer 503 via a conductive portion (not shown), and the conductive portion may include via or wire patterns (not shown) that are provided between the first surface 500a of the image sensor chip 500 and the circuit layer 503.

The connection terminal CT may be interposed between the memory chip 200 and the re-distribution layer 400. The mold layer 300 may be extended into a gap region between the memory chip 200 and the re-distribution layer 400 to cover a side surface of the connection terminal CT. In certain example embodiments, an under fill layer (not shown) may be extended into the gap region between the memory chip 200 and the re-distribution layer 400 to cover the side surface of the connection terminal CT. The connection terminal CT may be coupled to the chip pad 201. The connection terminal CT may be provided in the form of, for example, a bump, a solder ball, or a pillar. The connection terminal CT may be formed of or include a metal. For example, the connection terminal CT may include, for example, silver (Ag), tin (Sn), bismuth (Bi), or alloys thereof. In the case where the connection terminal CT is a bump provided on the bottom surface of the memory chip 200 or a bonding wire provided on the top surface of the memory chip 200, the memory chip 200 may be electrically connected to the image sensor chip 500 via the substrate 100. In some example embodiments, the memory chip 200 may be electrically connected to the image sensor chip 500 through the connection terminal CT, but not through the substrate 100. Such connection may reduce a length of a connection path between the memory chip 200 and the image sensor chip 500, thereby increasing a speed of signals to be transmitted between the memory chip 200 and the image sensor chip 500. In some example embodiments, decoding time to decode data obtained by the image sensor chip 500 may be reduced, thereby mitigating or preventing an image distortion phenomenon from occurring in the semiconductor package 1. In the present specification, an expression of "an element is electrically connected to the image sensor chip 500" means that the element is electrically connected to integrated devices or integrated circuits provided in the image sensor chip 500.

The re-distribution layer 400 may be provided between the memory chip 200 and the image sensor chip 500 and between the mold layer 300 and the image sensor chip 500. The re-distribution layer 400 may include insulating layers 410 and a re-distribution pattern 420. A first pad 451 may be provided on a bottom surface of the re-distribution layer 400 and may be coupled to the connection terminal CT. The insulating layers 410 may be stacked on the first surface 500a of the image sensor chip 500. The insulating layers 410 may be formed of or include, for example, an organic material. The re-distribution pattern 420 may include a conductive layer and a conductive via. The conductive layer may be provided between the insulating layers 410. The conductive via may be provided to penetrate at least one of the insulating layers 410 and may be coupled to the conductive layer. The first pad 451 may be electrically connected to the second pad 452 through the re-distribution pattern 420. The first pad 451 may not be aligned to the second pad 452 in a third direction D3. Here, the third direction D3 may be perpendicular to the first direction D1 and the second direction D2. In some example embodiments, the re-distribution pattern 420 may place the second pad 452 without being constrained by positions of the connection terminals CTs. For example, when viewed in a plan view, the second pad 452 may be placed outside the memory chip 200. Accordingly, a degree of freedom in arranging integrated circuits in the image sensor chip 500 may increase.

A holder 800 may be provided on the substrate 100 to support a lens 810. The holder 800 may include an engineering plastic. The lens 810 may be provided at an upper portion of the holder 800 which is apart from the image sensor chip 500, and may face the image sensor chip 500. The lens 810 may be formed of or include a transparent material (e.g., glass), allowing light to pass therethrough.

Figure 2A:
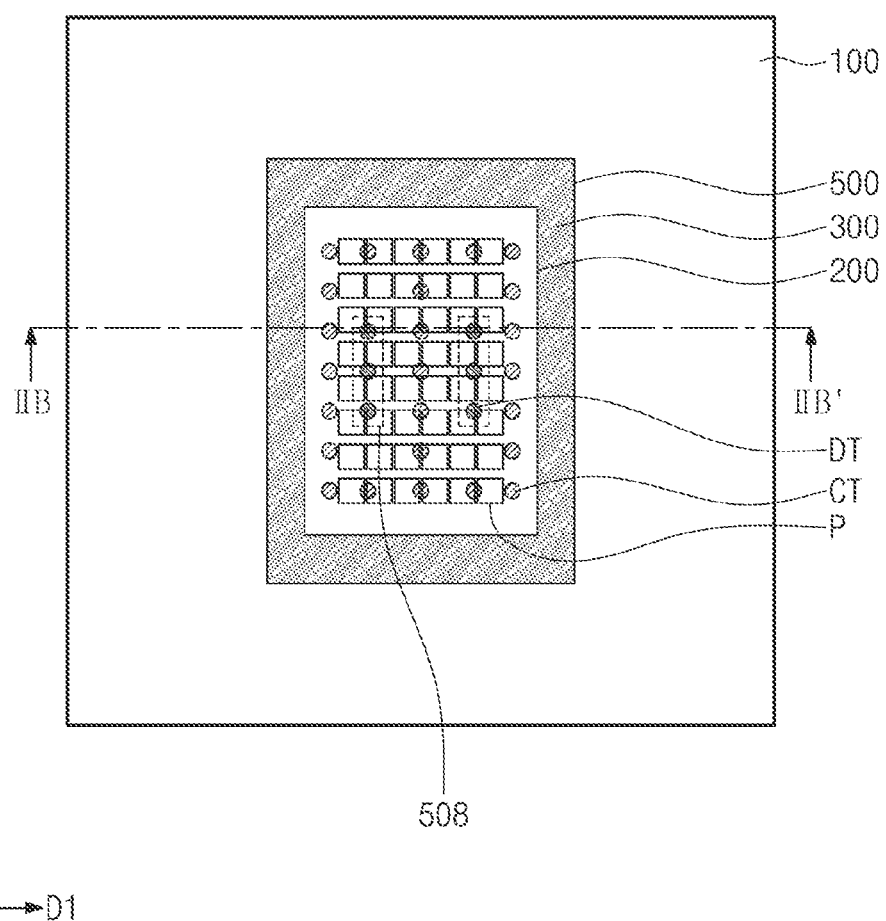
FIG. 2A is a sectional view illustrating a semiconductor package according to an example embodiment of the inventive concepts.
Figure 2B:
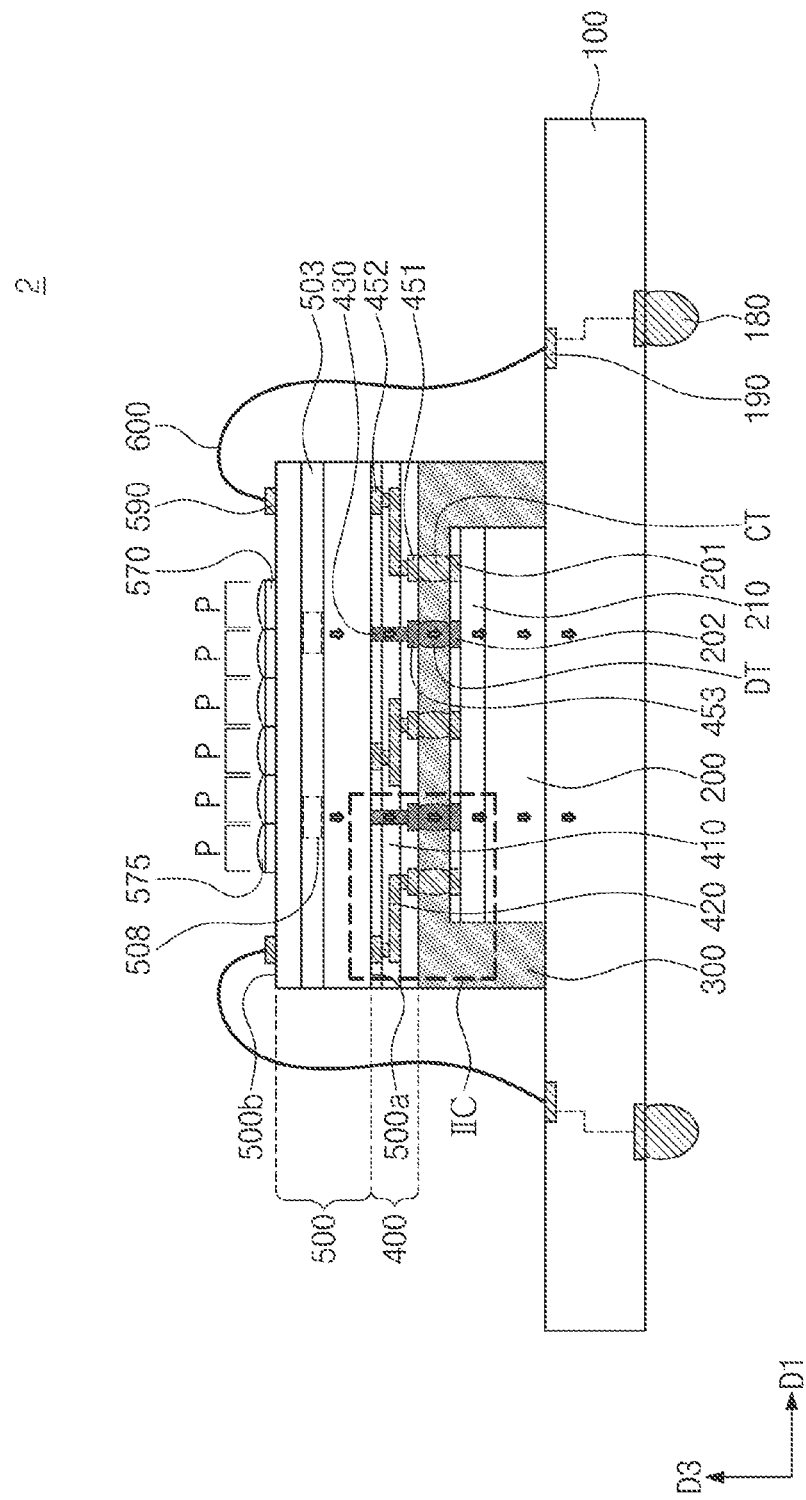
FIG. 2B is a sectional view taken along line IIB-IIB' of FIG. 2A.
Figure 2C:
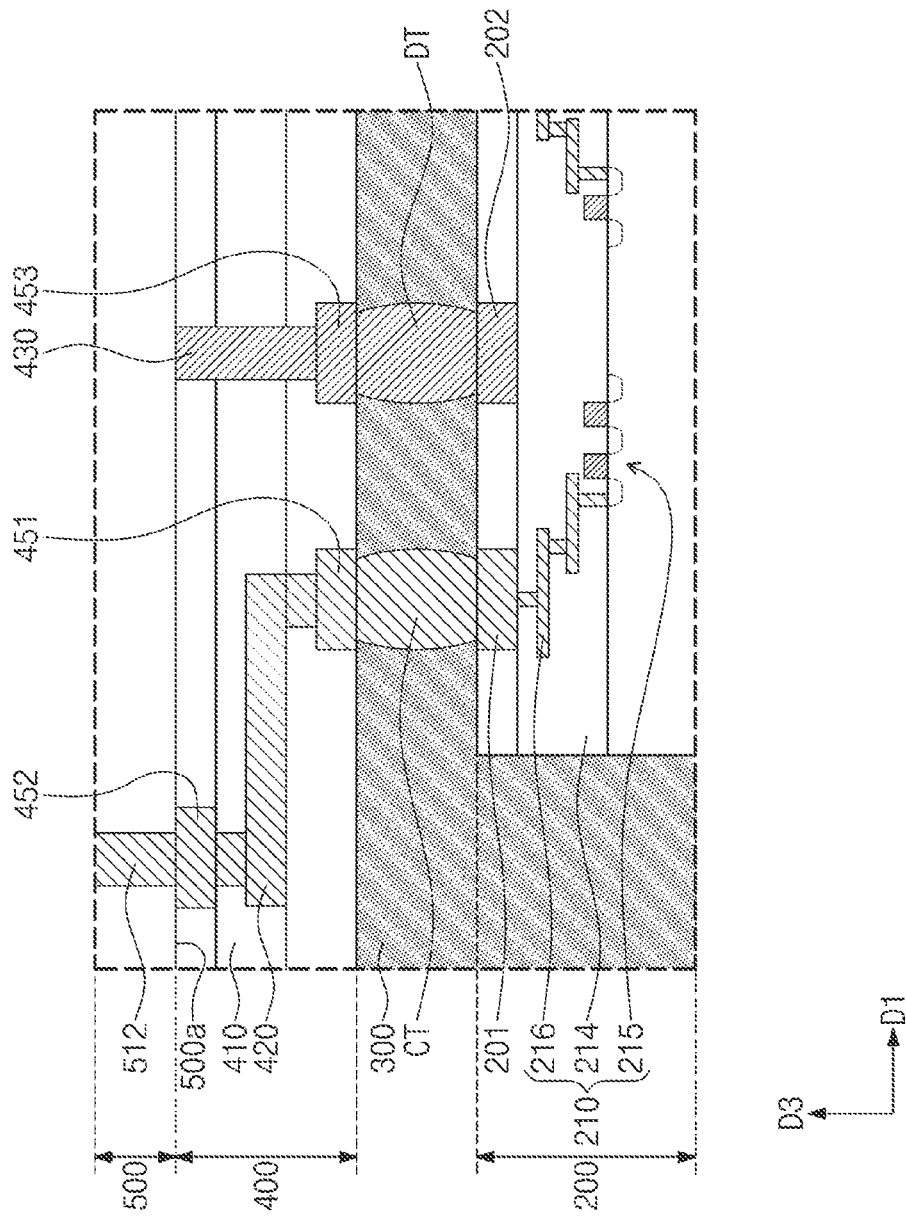
FIG. 2C is an enlarged sectional view of a region IIC of FIG. 2B.

FIG. 2A is a sectional view illustrating a semiconductor package according to an example embodiment of the inventive concepts. FIG. 2B is a sectional view taken along line IIB-IIB' of FIG. 2A. FIG. 2C is an enlarged sectional view of a region IIC of FIG. 2B. For the sake of brevity, the elements and features of this example that are same as or similar to those previously shown and described will not be described in much further detail.

Referring to FIGS. 2A and 2B, a semiconductor package 2 may include a dummy terminal DT, in addition to the substrate 100, the memory chip 200, the mold layer 300, the connection terminal CT, the re-distribution layer 400, and the image sensor chip 500. Although not shown, the holder 800 and the lens 810 may be further provided on the substrate 100, as shown in FIG. 1B. An adhesive layer (not shown) may be interposed between the substrate 100 and the memory chip 200.

Referring to FIG. 2C in conjunction with FIGS. 2A and 2B, the memory chip 200 may include the circuit pattern layer 210. The circuit pattern layer 210 may include a circuit insulating layer 214, wires 216, and integrated devices 215. Although not shown, the circuit insulating layer 214 may include a plurality of layers. The wires 216 and the integrated devices 215 may be provided in the circuit insulating layer 214. For example, the integrated devices 215 may include transistors. The integrated devices 215 may be electrically connected to the chip pad 201 through the wires 216.

The connection terminal CT may be interposed between the memory chip 200 and the re-distribution layer 400. The connection terminal CT may be electrically connected to the integrated devices 215 through the chip pad 201 and the wires 216.

The re-distribution layer 400 may be provided on the first surface 500a of the image sensor chip 500. The re-distribution layer 400 may further include a metal pattern 430, in addition to the insulating layers 410 and the re-distribution pattern 420. The insulating layers 410 and the re-distribution pattern 420 may be configured to have the same as or substantially similar to those of FIG. 1B. The second pad 452 may be electrically connected to a first pad 251 through the re-distribution pattern 420. A first via 512 may be provided on the second pad 452, and the first via 512 will be described in more detail below.

A dummy pad 202 may be provided on the top surface of the memory chip 200. The dummy pad 202 may be electrically separated from the integrated devices 215. The dummy pad 202 may be formed of or include a conductive material (e.g., at least one of metals). The dummy terminal DT may be provided on the dummy pad 202 and may be spaced apart from the connection terminal CT. The dummy terminal DT may be provided in the form of, for example, a bump, a solder ball, or a pillar. The dummy terminal DT may be electrically disconnected from the integrated devices 215 and the re-distribution pattern 420. The dummy terminal DT may be formed of or include a conductive material (e.g., at least one of metals). The metal pattern 430 may be provided to penetrate the insulating layers 410. A third pad 453 may be provided on a bottom surface of the re-distribution layer 400 and may be coupled to the dummy terminal DT. The metal pattern 430 may be provided on the third pad 453. The metal pattern 430 may be connected to the third pad 453. At least a portion (e.g., a top surface) of the metal pattern 430 may be in physical contact with the image sensor chip 500.

A heating source 508 may be provided in the circuit layer 503 of the image sensor chip 500. The heating source 508 may be an IP block in the circuit layer 503. The heating source 508 is not limited to the illustrated example and may be arranged in various manners depending on kinds and positions of the integrated circuits in the circuit layer 503. During an operation of the image sensor chip 500, heat generated in the heating source 508 may flow toward the second surface 500b of the image sensor chip 500, thereby causing a noise issue (e.g., a dark current) in the pixels P. When viewed in a plan view, the dummy terminal DT may overlap the heating source 508. A planar arrangement of the dummy terminal DT may be variously changed depending on the position of the heating source 508. The metal pattern 430 may have a relatively high thermal conductivity (e.g., of 60 W/mK). In some example embodiments, the heat generated in the heating source 508 may flow into the metal pattern 430 through a lower portion of the image sensor chip 500, as depicted by the arrow. The insulating layers 410 may have a thermal conductivity lower than that of the image sensor chip 500. The metal pattern 430 may be in physical contact with the image sensor chip 500, and thus the heat generated in the heating source 508 can be more quickly transmitted to the metal pattern 430. The third pad 453, the dummy terminal DT, the dummy pad 202, and the memory chip 200 may have thermal conductivities greater than that of the mold layer 300. For example, the dummy terminal DT, the memory chip 200, and the mold layer 300 may have thermal conductivities of about 117.5 W/mK, about 60 W/mK, and about 0.88 W/mK, respectively. The heat transmitted to the metal pattern 430 may be quickly transmitted to the memory chip 200 through the dummy terminal DT. Accordingly, a heat emission property of the image sensor chip 500 may be improved. In some example embodiments, when viewed in a plan view, the dummy terminal DT may be arranged to overlap with the pixels P of the image sensor chip 500, as shown in FIG. 2A. The dummy terminal DT may prevent or suppress heat from being transmitted to the pixels P. Accordingly, the image sensor chip 500 may be suppressed or prevented from suffering from the noise issue caused by heat, and thus an image quality of the image sensor chip 500 may be improved.

Figure 3A:
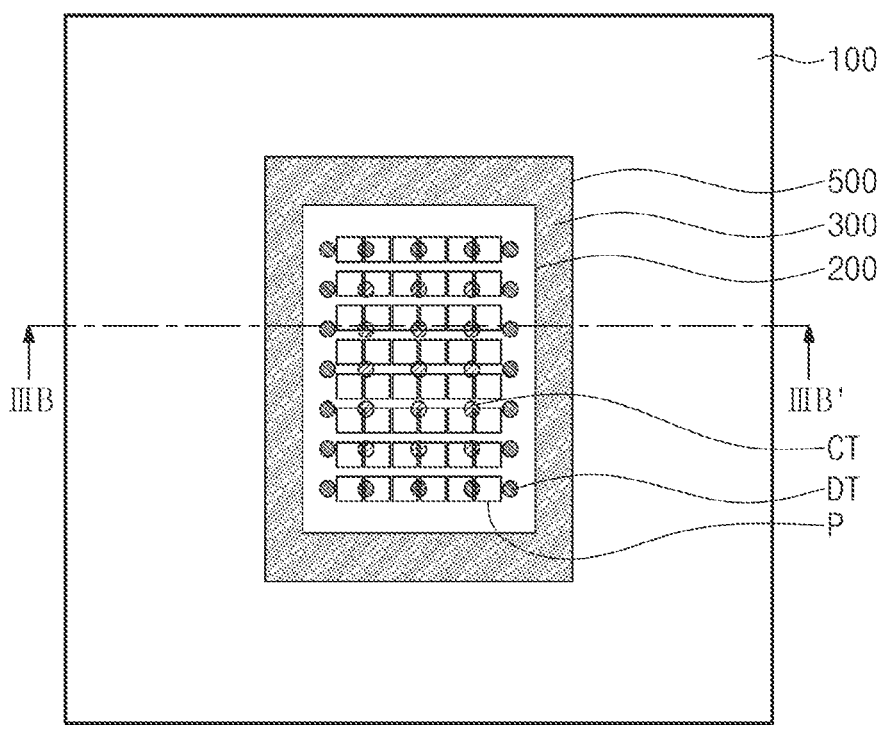
FIG. 3A is a sectional view illustrating a semiconductor package according to an example embodiment of the inventive concepts.
Figure 3A:
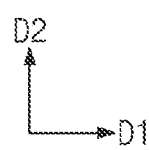
Figure 3B:
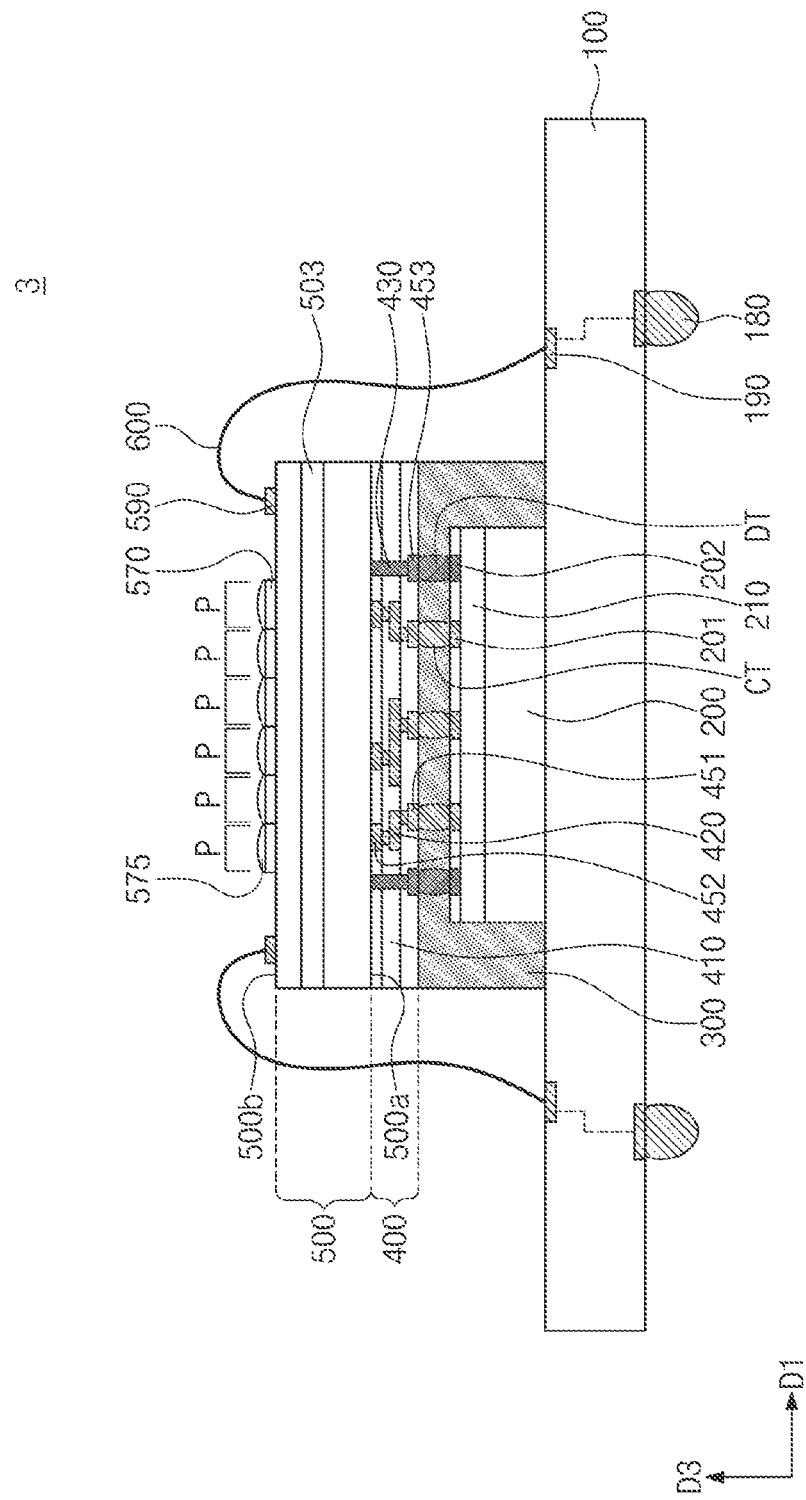
FIG. 3B is a sectional view taken along line IIIB-IIIB' of FIG. 3A.

FIG. 3A is a sectional view illustrating a semiconductor package according to an example embodiment of the inventive concepts. FIG. 3B is a sectional view taken along line IIIB-IIIB' of FIG. 3A. For the sake of brevity, again, the elements and features of this example that are the same as or substantially similar to those previously shown and described will not be described in much further detail.

Referring to FIGS. 3A and 3B, a semiconductor package 3 may include the substrate 100, the memory chip 200, the mold layer 300, the connection terminal CT, the dummy terminal DT, the re-distribution layer 400, and the image sensor chip 500. The substrate 100, the memory chip 200, the mold layer 300, and the re-distribution layer 400 may be configured to have the same as or substantially similar to those described with reference to FIGS. 1A to 2C. Although not shown, the holder 800 of FIG. 1B and the lens 810 may be further provided on the substrate 100.

The connection terminal CT and the dummy terminal DT may be interposed between the memory chip 200 and the re-distribution layer 400. When viewed in a plan view, the connection terminal CT may be provided at a center region of the memory chip 200. When viewed in a plan view, the dummy terminal DT may be provided at an edge region of the memory chip 200. Planar arrangements of the connection terminal CT and the dummy terminal DT are not limited to the illustrated example and may be variously changed. The connection terminal CT and the dummy terminal DT may be configured to have the same electric connection structure as or substantially similar electric connection structure to that described with reference to FIGS. 1A to 2C.

Figure 4:
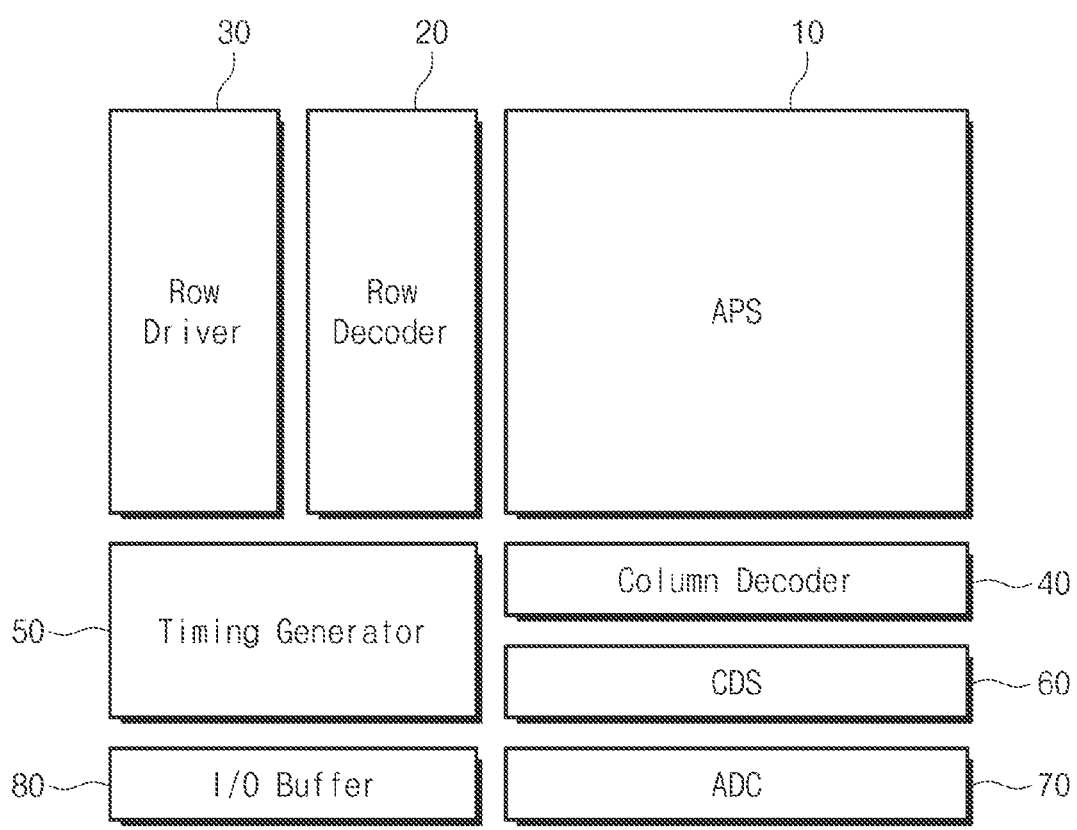
FIG. 4 is a block diagram illustrating an image sensor according to an example embodiment of the inventive concepts.

FIG. 4 is a block diagram illustrating an image sensor according to an example embodiment of the inventive concepts.

Referring to FIG. 4, the image sensor chip 500 may include an active pixel sensor (APS) array 10, a row decoder 20, a row driver 30, a column decoder 40, a timing generator 50, a correlated double sampler (CDS) 60, an analog-to-digital converter (ADC) 70, and an I/O buffer 80. The APS array 10 may include a plurality of pixels P, which are two-dimensionally arranged, and may be used to convert incident light into electrical signals. Electrical signals generated in the APS array 10 may be transmitted to the CDS 60.

The row driver 30 may be configured to provide a plurality of driving signals, which are used to operate the pixels P, to the APS array 10 in accordance with decoding results obtained by the row decoder 20. The driving signals may include, for example, selection signals, reset signals, or charge transmission signals. In the case where the pixels P are arranged in a matrix shape, the driving signals may be provided to each of the rows. The timing generator 50 may provide timing and control signals to the row decoder 20 and the column decoder 40.

The CDS 60 may receive the electric signals, which are generated in the APS array 10, and may perform a holding and sampling operation on the received electric signals. The CDS 60 may be configured to perform a double sampling operation, based on a specific noise level and a signal level of the electric signal, and to output a difference level corresponding to a difference between the noise and signal levels.

The ADC 70 may convert analog signals corresponding to the difference level output from the CDS 60 into digital signals, and then output the converted digital signals. The I/O buffer 80 may latch the digital signal, and then output the latched digital signals sequentially to an image signal processing unit (not shown) in accordance with the decoding result obtained from the column decoder 40.

Figure 5A:
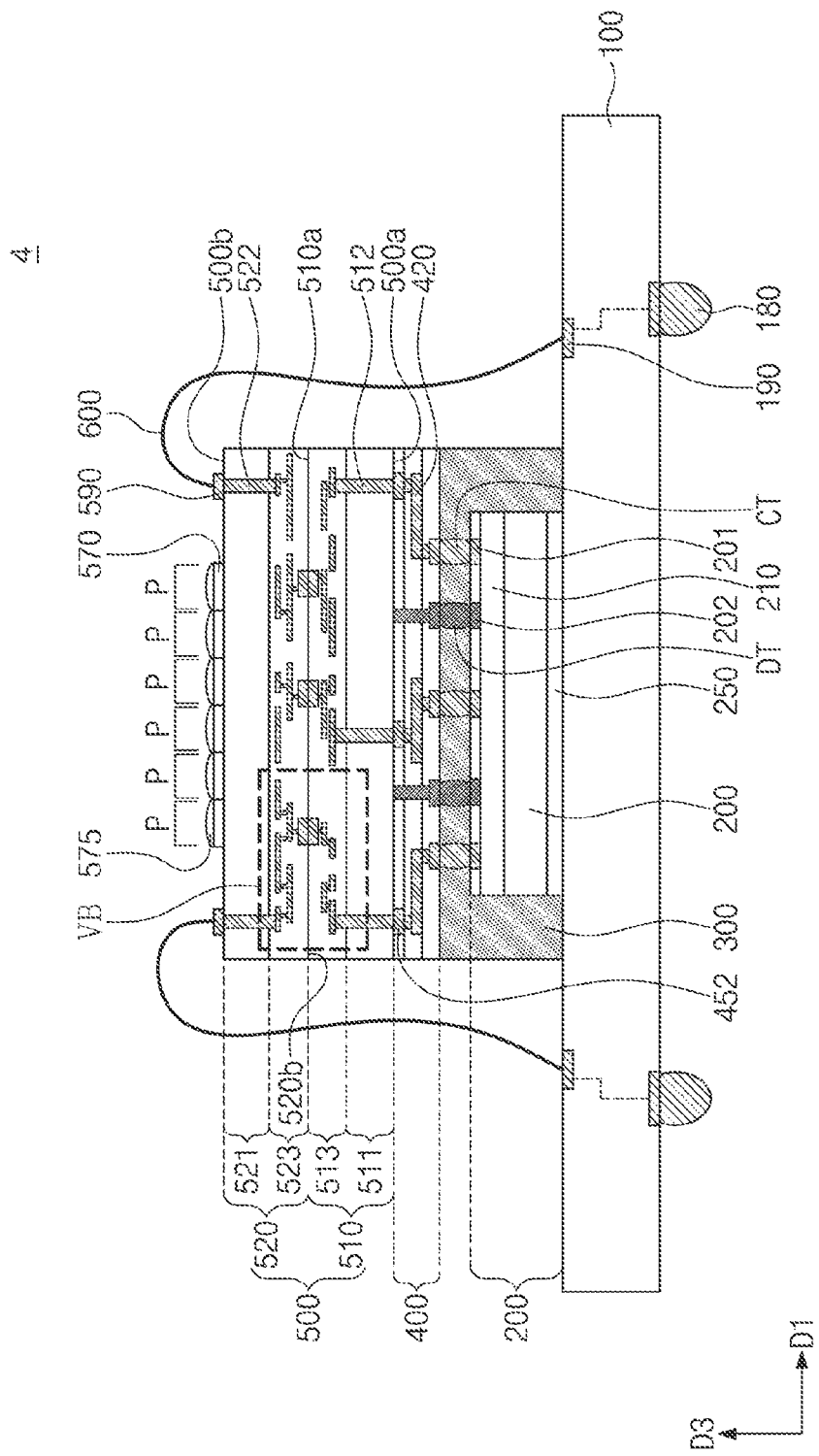
FIG. 5A is a sectional view illustrating a semiconductor package according to an example embodiment of the inventive concepts.
Figure 5B:
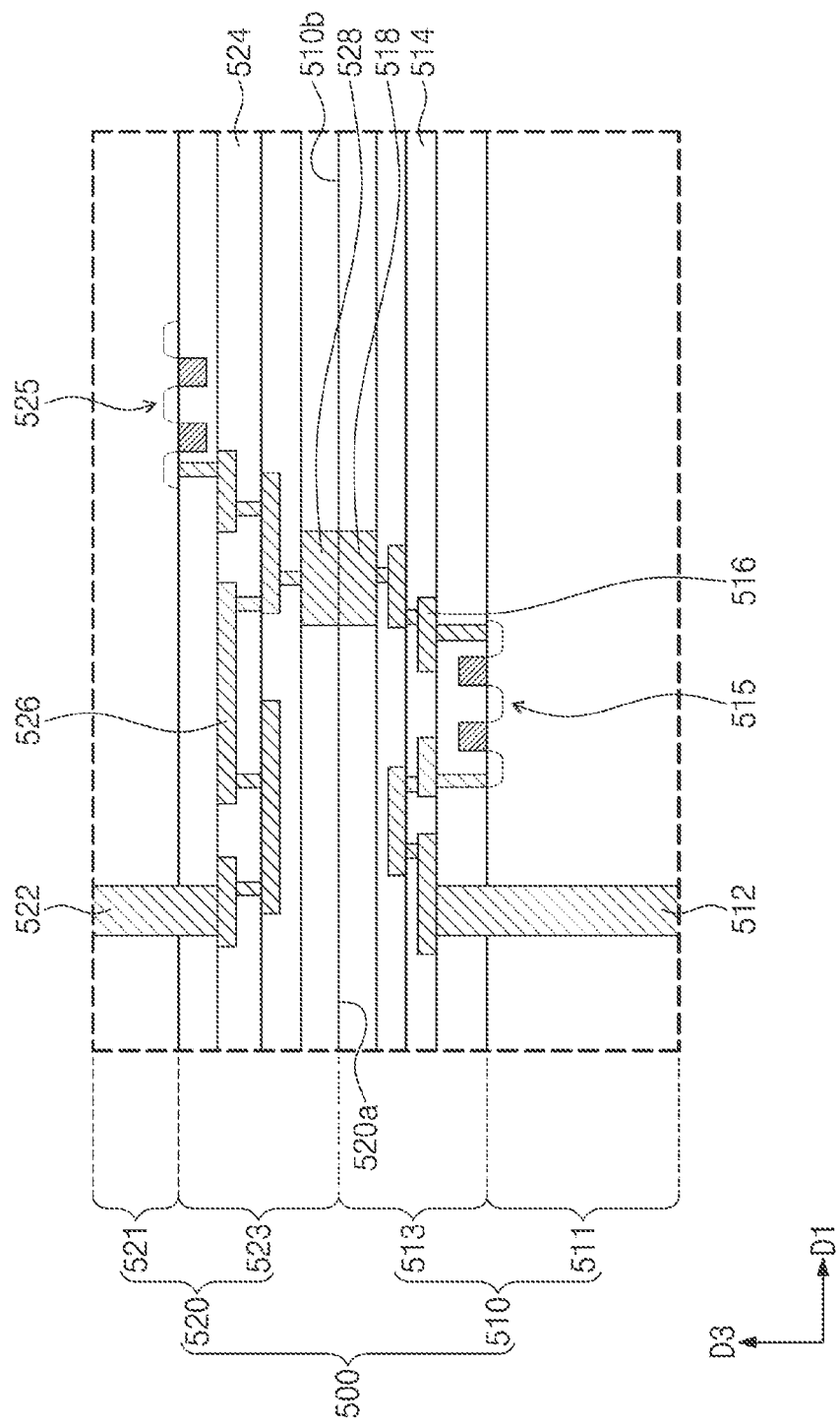
FIG. 5B is an enlarged sectional view of a region VB of FIG. 5A.

FIG. 5A is a sectional view illustrating a semiconductor package according to an example embodiment of the inventive concepts. FIG. 5B is an enlarged sectional view of a region VB of FIG. 5A. For the sake of brevity, again, the elements and features of this example that are the same as or similar to those previously shown and described will not be described in much further detail.

Referring to FIG. 5A, a semiconductor package 4 may include the substrate 100, the memory chip 200, the mold layer 300, the connection terminal CT, the dummy terminal DT, the re-distribution layer 400, and the image sensor chip 500. The substrate 100, the memory chip 200, the mold layer 300, the re-distribution layer 400, the connection terminal CT, and the dummy terminal DT may be configured to have the same features as or substantially similar features to those described with reference to FIGS. 1A to 2C. Although not shown, the holder 800 of FIG. 1B and the lens 810 may be further provided on the substrate 100. In certain example embodiments, the dummy terminal DT may be omitted.

An adhesive layer 250 may be interposed between the substrate 100 and the memory chip 200. As an example, the adhesive layer 250 may include an insulating polymer.

The image sensor chip 500 may include a logic chip 510 and a sensing chip 520 on the logic chip 510. In some example embodiments, the sensing chip 520 may be stacked on the logic chip 510, thereby reducing a width and a length of the image sensor chip 500.

The logic chip 510 may include a first base layer 511, the first via 512, a first circuit layer 513, and a first bonding pad 518. The first base layer 511 may include a silicon substrate. The first via 512 may be provided to penetrate the first base layer 511. The first via 512 may be provided on the second pad 452 and may be coupled to the second pad 452. The first via 512 may be aligned to the second pad 452 in the third direction D3. The first via 512 may be electrically connected to the memory chip 200 through the re-distribution pattern 420 and the connection terminal CT. The first circuit layer 513 may be provided on the first base layer 511.

Referring to FIG. 5B in conjunction with FIG. 5A, the first circuit layer 513 may include first insulating layers 514, first integrated circuits 515, and first wire patterns 516. The first integrated circuits 515 may be provided on the first base layer 511. The first integrated circuits 515 may include at least one transistor. The first integrated circuits 515 may serve as at least one of the row decoder 20, the row driver 30, the column decoder 40, timing generator 50, the CDS 60, the ADC 70, or the I/O buffer 80 described with reference to FIG. 4. The first wire patterns 516 may be provided in the first insulating layers 514 and may be coupled to the first integrated circuits 515. The first wire patterns 516 may include a first metal pattern and a first metal via. The first metal pattern may be provided between the first insulating layers 514, and the first metal via may be provided to penetrate at least one of the first insulating layers 514 and may be coupled to the first metal pattern. The first via 512 may be electrically connected to the first integrated circuits 515 through the first wire patterns 516. The memory chip 200 may be electrically connected to the first integrated circuits 515 of the first circuit layer 513 through the first via 512. Thus, a length of a path electrically connecting the memory chip 200 to the first integrated circuits 515 of the logic chip 510 may be reduced. The first bonding pad 518 may be provided on a surface 510b of the logic chip 510. The surface 510b of the logic chip 510 may be used as an active surface. The logic chip 510 may be provided in such a way that the surface 510b faces the sensing chip 520. The first bonding pad 518 may be formed of or include a metal (e.g., copper).

The sensing chip 520 may include the active pixel sensor arrays 10 described with reference to FIG. 4. For example, the pixels P may be provided on the sensing chip 520. The sensing chip 520 may include a second circuit layer 523 and a second base layer 521. The second base layer 521 may include a silicon substrate. The logic chip 510 may be closer to the second circuit layer 523 than to the second base layer 521. The second circuit layer 523 may include second integrated circuits 525, second insulating layers 524, and second wire patterns 526. The second integrated circuits 525 may include sensing transistors. The second integrated circuits 525 may be electrically connected to the second wire patterns 526. A second bonding pad 528 may be provided on a surface 520a of the sensing chip 520 (e.g., the bottom surface of the second circuit layer 523), and may be coupled to the second wire patterns 526. The second integrated circuits 525 may be electrically connected to the first integrated circuits 515 through the first and second bonding pads 518 and 528.

Second vias 522 may be provided to penetrate at least a portion of the sensing chip 520. For example, the second vias 522 may be provided to penetrate the second base layer 521. The second vias 522 may be coupled to the connection pad 590. The first integrated circuits 515 may be electrically connected to one of the second vias 522 through the first and second wire patterns 516 and 526. For example, one of the second vias 522 may be used as a path electrically connecting the first integrated circuits 515 of the sensing chip 520 to the substrate 100. Another one of the second vias 522 may be electrically connected to the first via 512 through the first and second wire patterns 516 and 526 and the first and second bonding pads 518 and 528. For example, another one of the second vias 522 may be used as a path electrically connecting the memory chip 200 to the bonding wire 600. Still another one of the second vias 522 may be connected to the second integrated circuits 525 and the first via 512. Although not illustrated, the second vias 522 may be provided to penetrate the second circuit layer 523.

FIGS. 6A to 6E are sectional views illustrating a method of fabricating a semiconductor package, according to an example embodiment of the inventive concepts. For the sake of brevity, the elements and features of this example that are the same as or substantially similar to those previously shown and described will not be described in much further detail. In the following description, an upper portion, a lower portion, a top surface, and a bottom surface are described with respect to the semiconductor packages 1, 2, and 3 of FIGS. 1B, 2B, and 5A. In the following drawings, wire patterns and integrated devices in a circuit layer are omitted or are briefly illustrated.

Figure 6A:
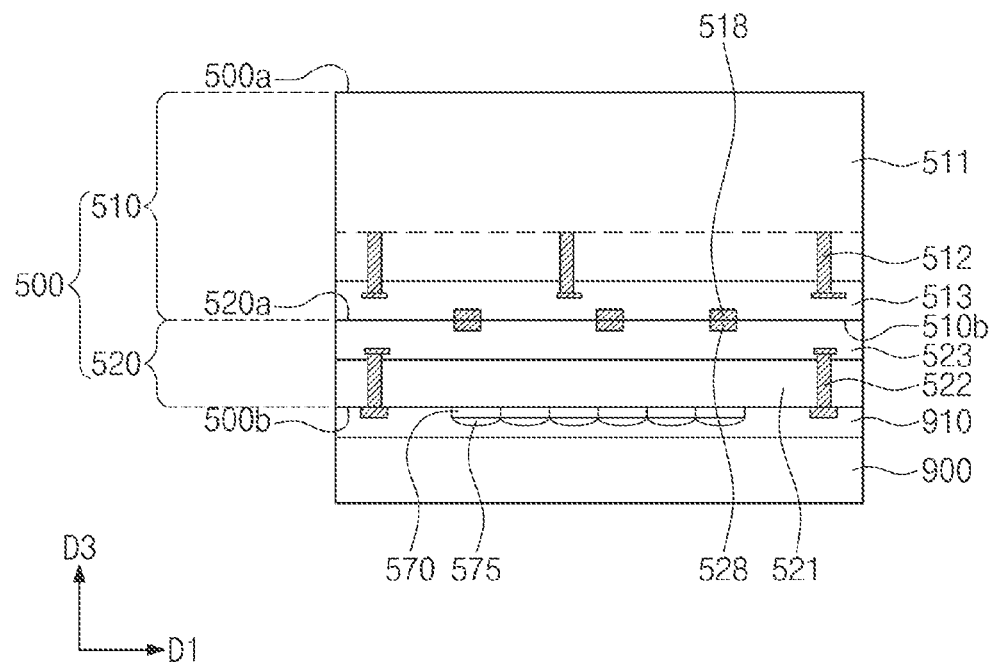
FIGS. 6A to 6E are sectional views illustrating a method of fabricating a semiconductor package, according to an example embodiment of the inventive concepts.

Referring to FIG. 6A in conjunction with FIG. 5B, the image sensor chip 500 may be prepared. For example, the color filters 570, the micro lens arrays 575, the second vias 522, the second circuit layer 523, and the second bonding pad 528, which constitute the sensing chip 520, may be formed on the second base layer 521. The second bonding pad 528 may be formed of or include a metal (e.g., copper). The first circuit layer 513, the first bonding pad 518, and the first via 512, which constitute the logic chip 510, may be formed on the first base layer 511. The first integrated circuits 515 (e.g., of FIG. 5B) of the first circuit layer 513 and the first via 512 may be formed by a via-middle process. For example, the first integrated circuits 515 may be formed on a surface of the first base layer 511. The first via 512 may be formed to penetrate the surface of the first base layer 511 and to extend into a portion of the first base layer 511. Thereafter, the first insulating layers 514 and the first wire patterns 516, which constitute the first circuit layer 513, may be formed on the surface of the first base layer 511. The first bonding pad 518 may be formed on the first circuit layer 513. For example, the first bonding pad 518 may be formed of or include a metal (e.g., copper).

The sensing chip 520 and the logic chip 510, which constitute the image sensor chip 500, may be electrically connected to each other. The sensing chip 520 and the logic chip 510 may be electrically connected to each other by a direct bonding process. For example, the logic chip 510 may be provided on the sensing chip 520 in such a way that the first bonding pad 518 is aligned to the second bonding pad 528. A thermal treatment process may be performed on the sensing chip 520 and the logic chip 510 to connect the second bonding pad 528 to the first bonding pad 518. The process for connecting the sensing chip 520 to the logic chip 510 (e.g., the thermal treatment process) may be performed at temperature of about 350° C. through 400° C.

The image sensor chip 500 may be formed on a carrier substrate 900. Here, the image sensor chip 500 may be formed in such a way that the second surface 500*b* faces the carrier substrate 900. A carrier adhesive layer 910 may be formed between the carrier substrate 900 and the image sensor chip 500.

A thinning process may be performed on the logic chip 510 (e.g., the first base layer 511) to expose the first via 512. For example, a grinding process may be performed on an opposite surface of the logic chip 510 to expose the first via 512. The opposite surface of the logic chip 510 may be opposite to the surface 510*b*. The opposite surface of the logic chip 510 may adjoin the first surface 500*a* of the image sensor chip 500.

Figure 6B:
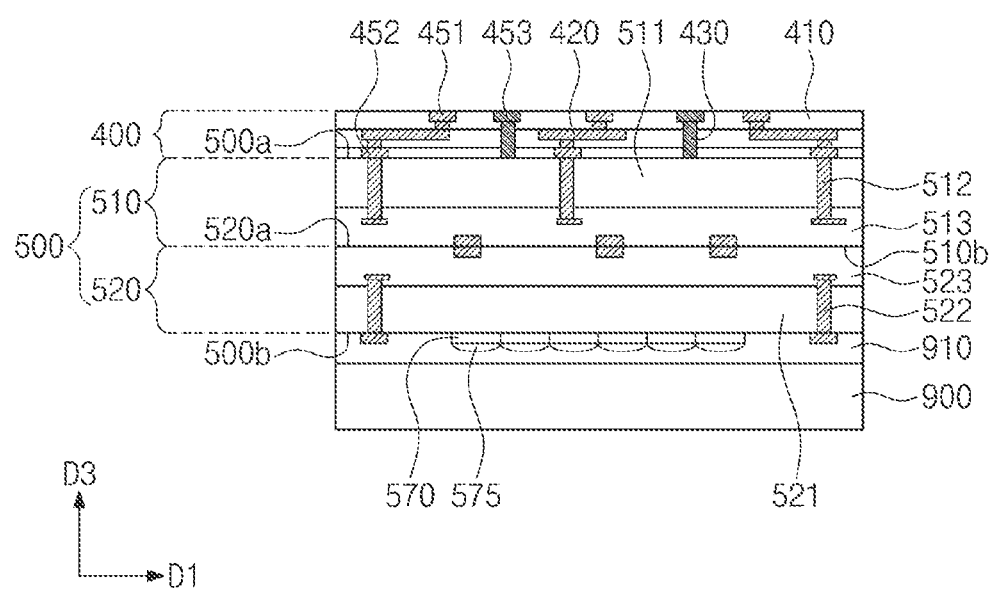

Referring to FIG. 6B, the re-distribution pattern 420 may be formed on the first surface 500*a* of the image sensor chip 500. For example, the insulating layers 410, and the first to third pads 451, 452, and 453, which constitute re-distribution layer 400 may be formed on the logic chip 510. The re-distribution pattern 420 may be electrically connected to the first via 512. The re-distribution pattern 420 may be the same features as or substantially similar features to those described with reference to FIGS. 1A and 1B. For example, the third pad 453 may not be aligned to the first and second pads 451 and 452 in the third direction D3.

Figure 6C:
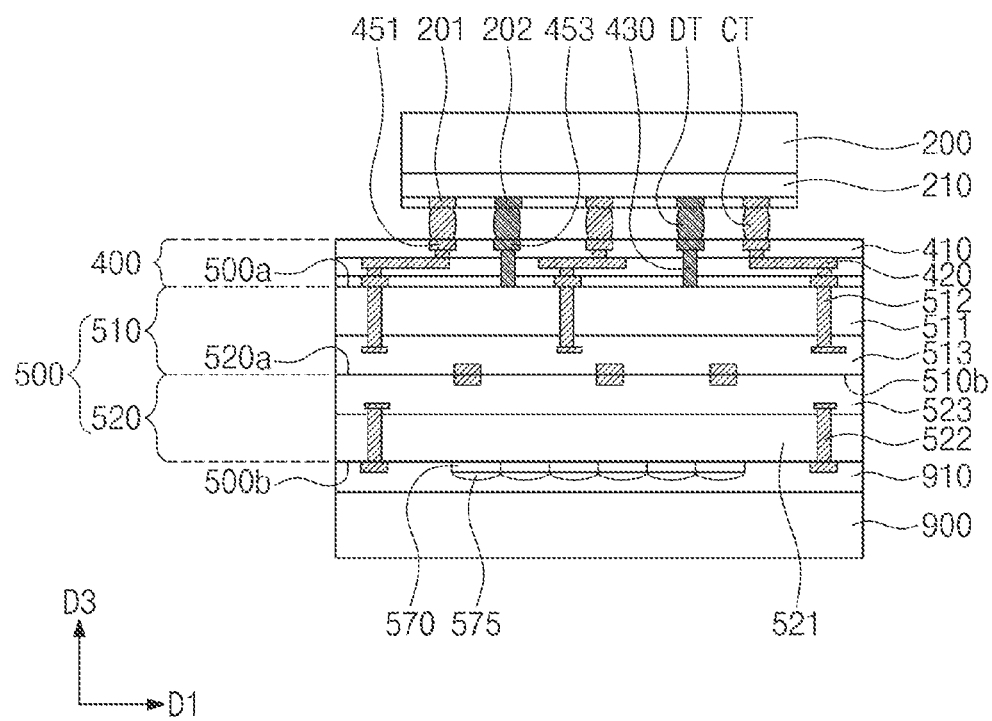

Referring to FIG. 6C, the memory chip 200 may be mounted on the re-distribution pattern 420 and may be electrically connected to the image sensor chip 500. The memory chip 200 may include the chip pad 201 and the dummy pad 202 which are provided on a bottom surface thereof. For example, the chip pad 201 may be formed of or include aluminum. Electric characteristics of the memory chip 200 may be measured in advance before the mounting process of the memory chip 200. For example, the measurement of the electric characteristics of the memory chip 200 may be performed using a measurement apparatus (not shown), in which a probe is configured to directly contact the chip pad 201. In some example embodiments, an electrical die sorting (EDS) test may be performed to measure the electric characteristics of the memory chip 200. If the memory chip 200 is measured to have good electric characteristics, it can be used as a part of a semiconductor package. Thus, a production yield of the semiconductor package may increase.

In the case where the mounting process of the memory chip 200 is performed at high temperature of about 350° C. or higher (e.g., by a direct bonding process), the memory chip 200 may be damaged by heat. The mounting process of the memory chip 200 may include electrically connecting the memory chip 200 to the image sensor chip 500. In some example embodiments, the connection terminal CT may be formed between the memory chip 200 and the image sensor chip 500 so that the memory chip 200 may be electrically connected to the image sensor chip 500. The connection terminal CT may be formed through the reflow process to be performed at a lower temperature for a shorter time. For example, the connection terminal CT may be formed at a temperature ranging from about 200° C. to about 250° C. (e.g., about 230° C.). The connection terminal CT may be reflowed for about 10 seconds. Accordingly, the image sensor chip 500 and/or the memory chip 200 may be suppressed or prevented from being damaged during the process of fabricating the semiconductor package. The dummy terminal DT may be formed between the memory chip 200 and the re-distribution pattern 420. The dummy terminal DT may be formed by the reflow process. The dummy terminal DT and the connection terminal CT may be formed by a single process. The dummy terminal DT may contain the same material as the connection terminal CT.

Figure 6D:
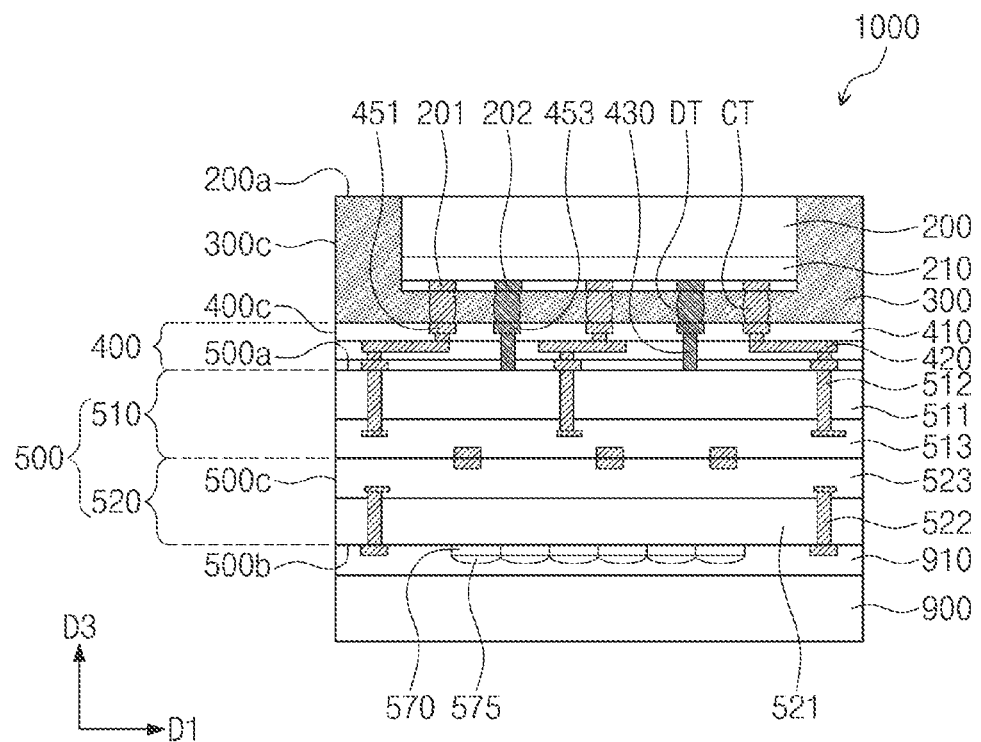

Referring to FIG. 6D, the mold layer 300 may be formed on the first surface 500*a* of the image sensor chip 500 to cover a side surface of the memory chip 200 and the re-distribution layer 400. The mold layer 300 may not cover a bottom surface 200*a* of the memory chip 200. A width of the mold layer 300 may be the same as or substantially similar to those of the re-distribution layer 400 and the image sensor chip 500. The side surface 300*c* of the mold layer 300 may be coplanar with a side surface 400*c* of the re-distribution layer 400 and the side surface 500*c* of the image sensor chip 500. According to the afore-described processes, the fabrication of a chip stack 1000 may be finished. The chip stack 1000 may include the memory chip 200, the mold layer 300, and the image sensor chip 500.

Figure 6E:
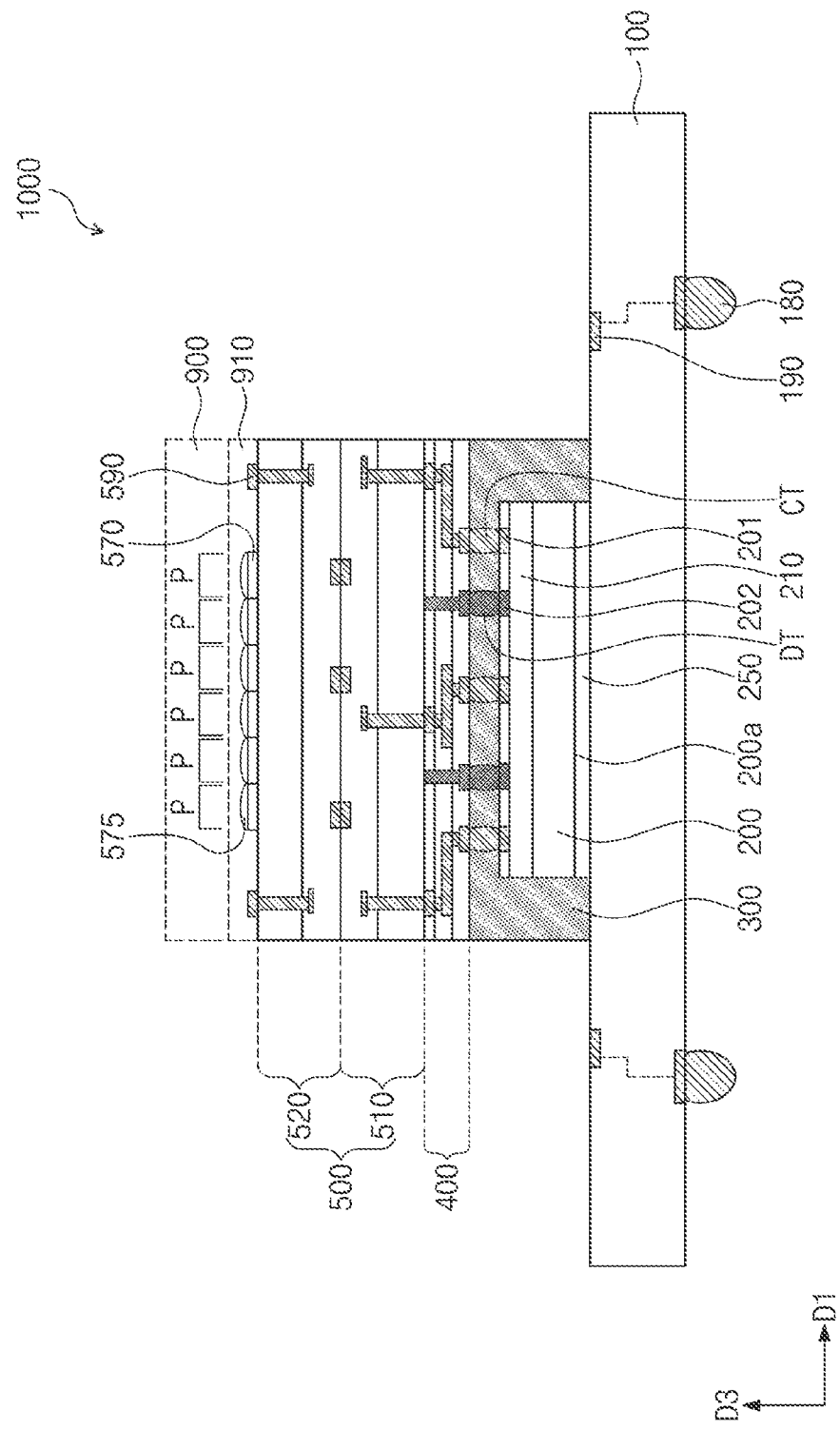

Referring to FIG. 6E, the chip stack 1000 may be turned upside down, and the chip stack 1000 may be provided on the substrate 100. Here, the memory chip 200 may be formed in such a way that the bottom surface 200*a* thereof faces the substrate 100. The adhesive layer 250 may be formed between the substrate 100 and the memory chip 200 to fasten the memory chip 200 to the substrate 100. The carrier substrate 900 and the carrier adhesive layer 910 may be removed to expose the micro lens arrays 575 and the connection pad 590. A cleaning process may be further performed on the first surface 500a of the image sensor chip 500 to remove impurities (e.g., residues of the carrier adhesive layer 910).

Referring back to FIG. 5A, the bonding wire 600 may be formed to be connected to the connection pad 590 and the substrate pad 190. According to the afore-described processes, the fabrication of the semiconductor package 4 may be finished.

FIGS. 7A to 7E are sectional views illustrating a method of fabricating a semiconductor package, according to an example embodiment of the inventive concepts. For the sake of brevity, the elements and features of this example that are the same as or similar to those previously shown and described will not be described in much further detail. In the following description, an upper portion, a lower portion, a top surface, and a bottom surface are described based on the semiconductor packages 1, 2, and 3 of FIGS. 1B, 2B, and 5A. In the following drawings, wire patterns and integrated devices in a circuit layer are omitted or are briefly illustrated.

Figure 7A:
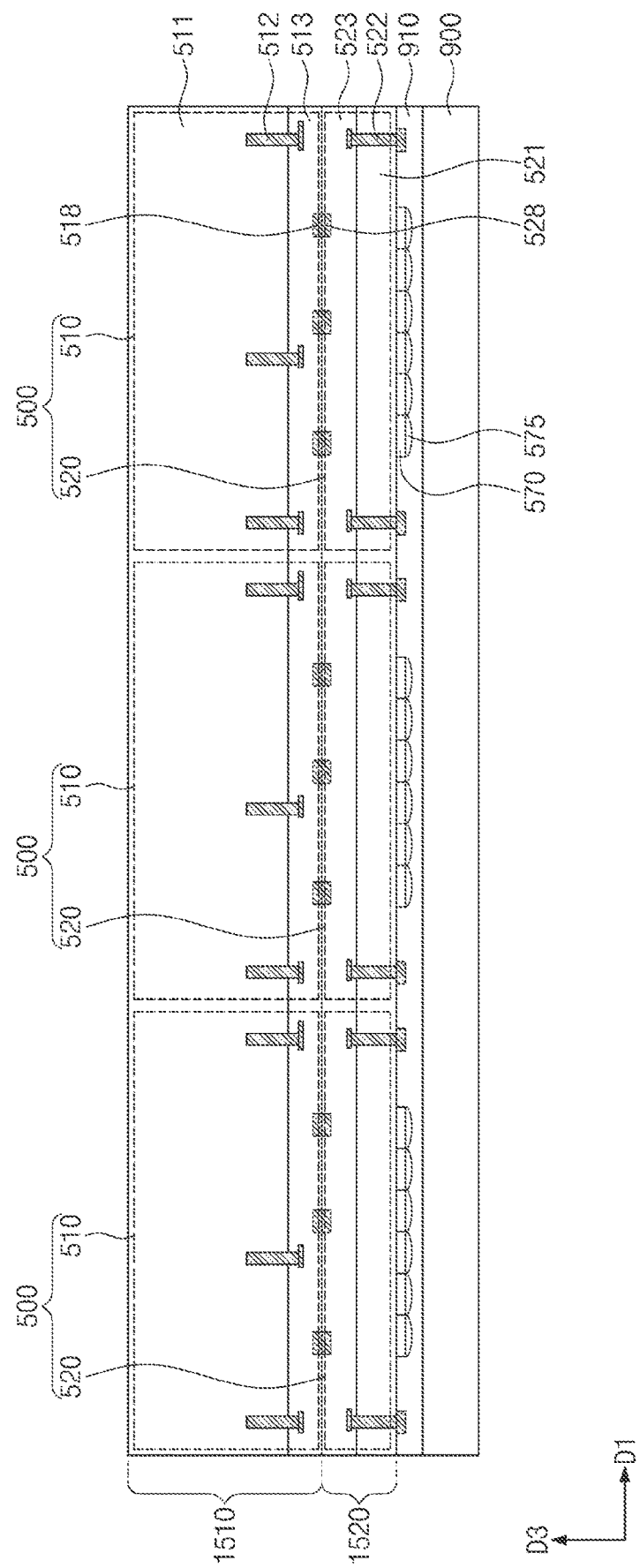
FIGS. 7A to 7E are sectional views illustrating a method of fabricating a semiconductor package, according to an example embodiment of the inventive concepts.

Referring to FIG. 7A in conjunction with FIG. 6A, a sensing substrate 1520 may be prepared. The sensing substrate 1520 may be provided in a form of a wafer. In some example embodiments, a plurality of the sensing chips 520 may be provided in the sensing substrate 1520. The sensing chips 520 may be formed using the same method as or substantially similar method to the method for forming the sensing chip 520 as illustrated in FIG. 6A. Each of the sensing chips 520 may include the second vias 522, the second circuit layer 523, and the second bonding pad 528.

A logic substrate 1510 may be prepared. The logic substrate 1510 may also be provided in a form of a wafer. In some example embodiments, a plurality of the logic chips 510 may be provided in the logic substrate 1510. The logic chips 510 may be formed using the same method as or substantially similar method to the method for forming the logic chip 510 as illustrated in FIG. 6A.

The logic substrate 1510 may be bonded to the sensing substrate 1520. Here, the sensing chips 520 may be electrically connected to the logic chips 510, respectively. The logic substrate 1510 may be bonded to the sensing substrate 1520 by a direct bonding process. The direct bonding process may be performed in the same manner as or substantially similar manner to the bonding method of the sensing chip 520 and the logic chip 510 as illustrated in FIG. 6A. For example, the logic substrate 1510 may be provided on the sensing substrate 1520 in such a way that the first bonding pad 518 is aligned to the second bonding pad 528. A thermal treatment process may be performed on the sensing substrate 1520 and the logic substrate 1510 to connect the second bonding pad 528 to the first bonding pad 518.

The sensing substrate 1520 may be provided on the carrier substrate 900. The carrier adhesive layer 910 may be formed between the carrier substrate 900 and the sensing substrate 1520. Hereinafter, a thinning process may be performed on the logic substrate 1510 to expose the first via 512.

Figure 7B:
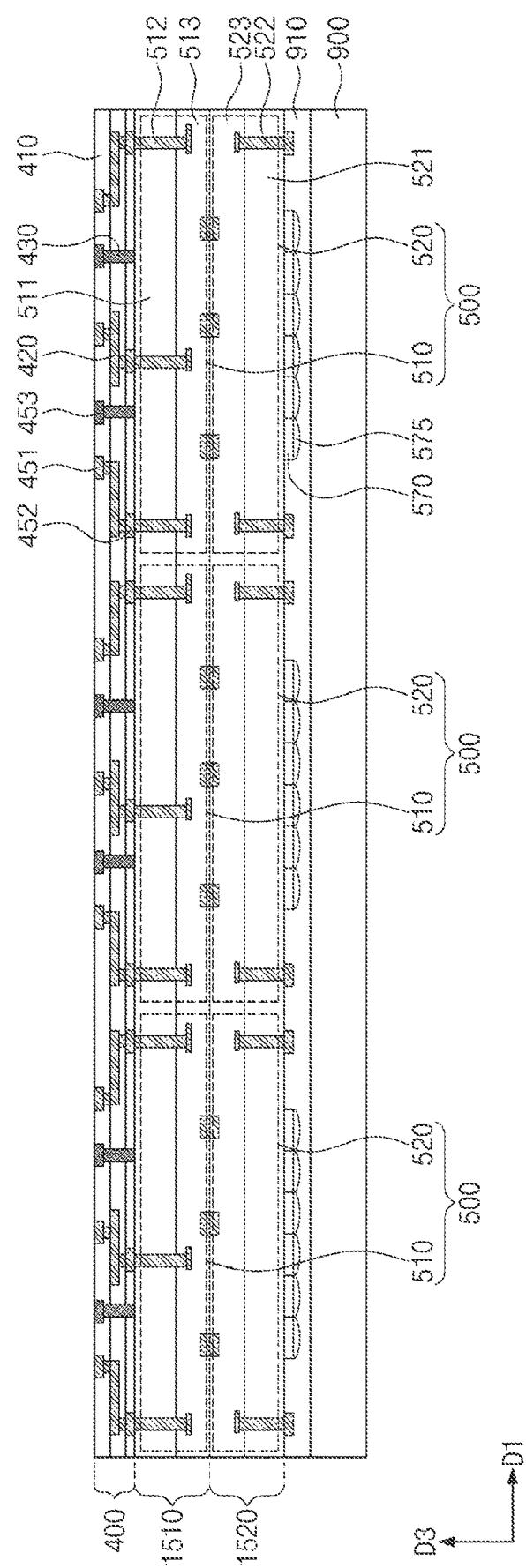

Referring to FIG. 7B, the re-distribution layer 400 may be formed on the logic substrate 1510 to cover the plurality of the logic chips 510.

Figure 7C:
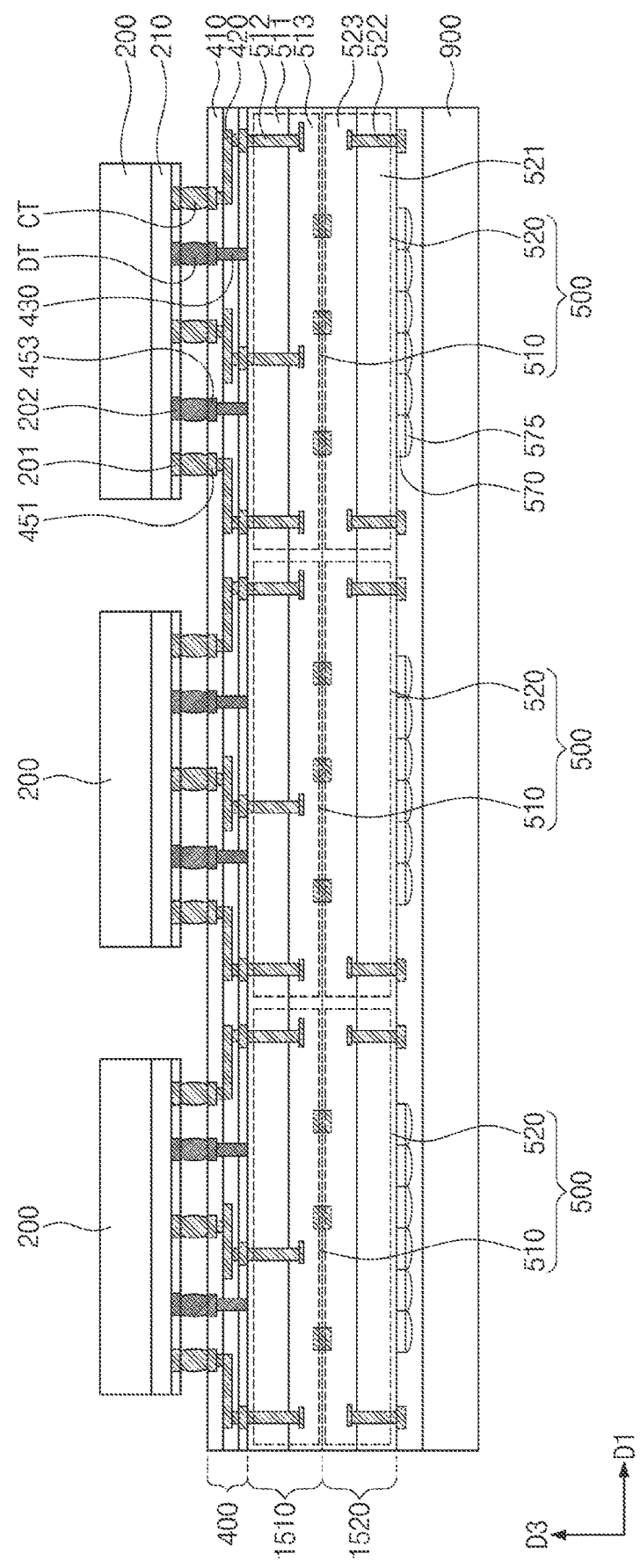

Referring to FIG. 7C, the memory chip 200 may be provided on the re-distribution pattern 420. The memory chip 200 may be formed by, for example, a chip-on-wafer process. In some example embodiments, a plurality of the memory chips 200 may be provided on the image sensor chips 500, respectively.

The connection terminals CT and the dummy terminals DT may be formed between the memory chips 200 and the re-distribution pattern 420. The connection terminals CT and the dummy terminals DT may be formed by the reflow process described with reference to FIG. 6C.

Figure 7D:
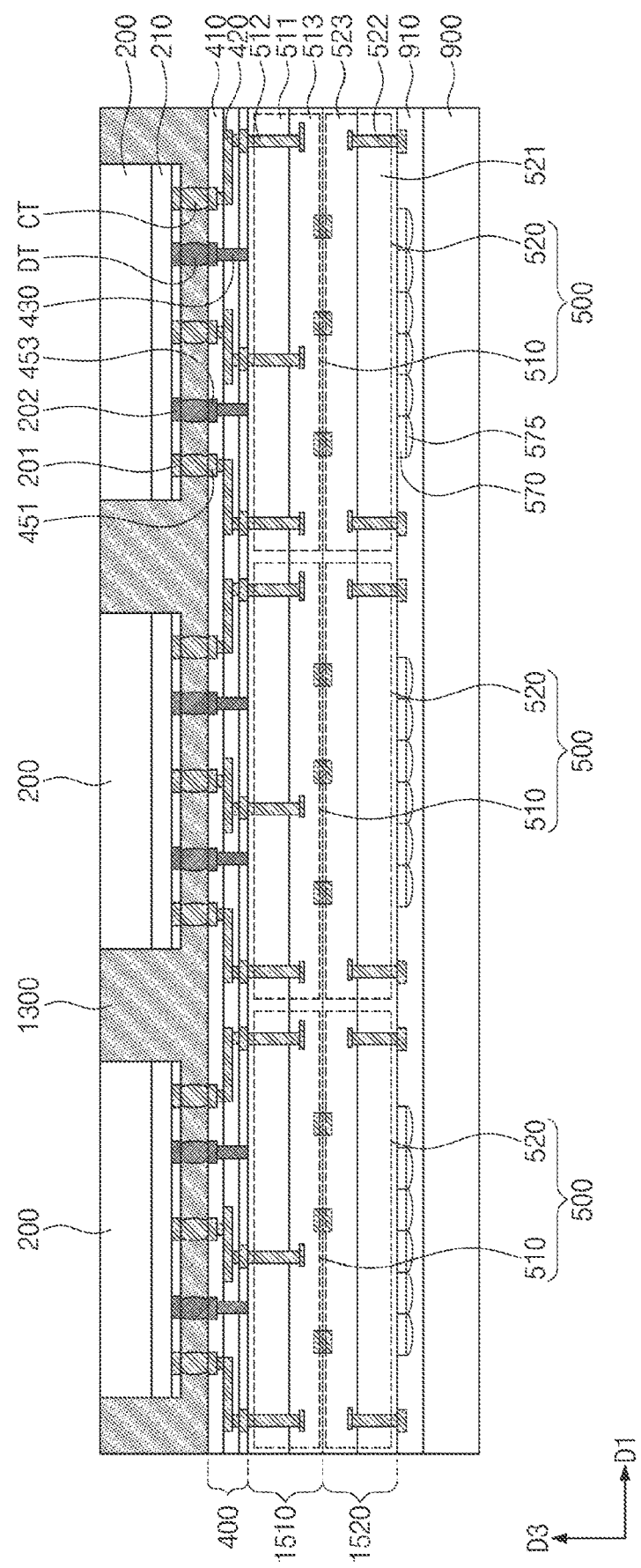

Referring to FIG. 7D, a molding pattern 1300 may be formed on the logic substrate 1510 to cover the memory chips 200. The molding pattern 1300 may be formed by the same method as or substantially similar method to the method for forming the mold layer 300 as illustrated in FIG. 6D.

Figure 7E:
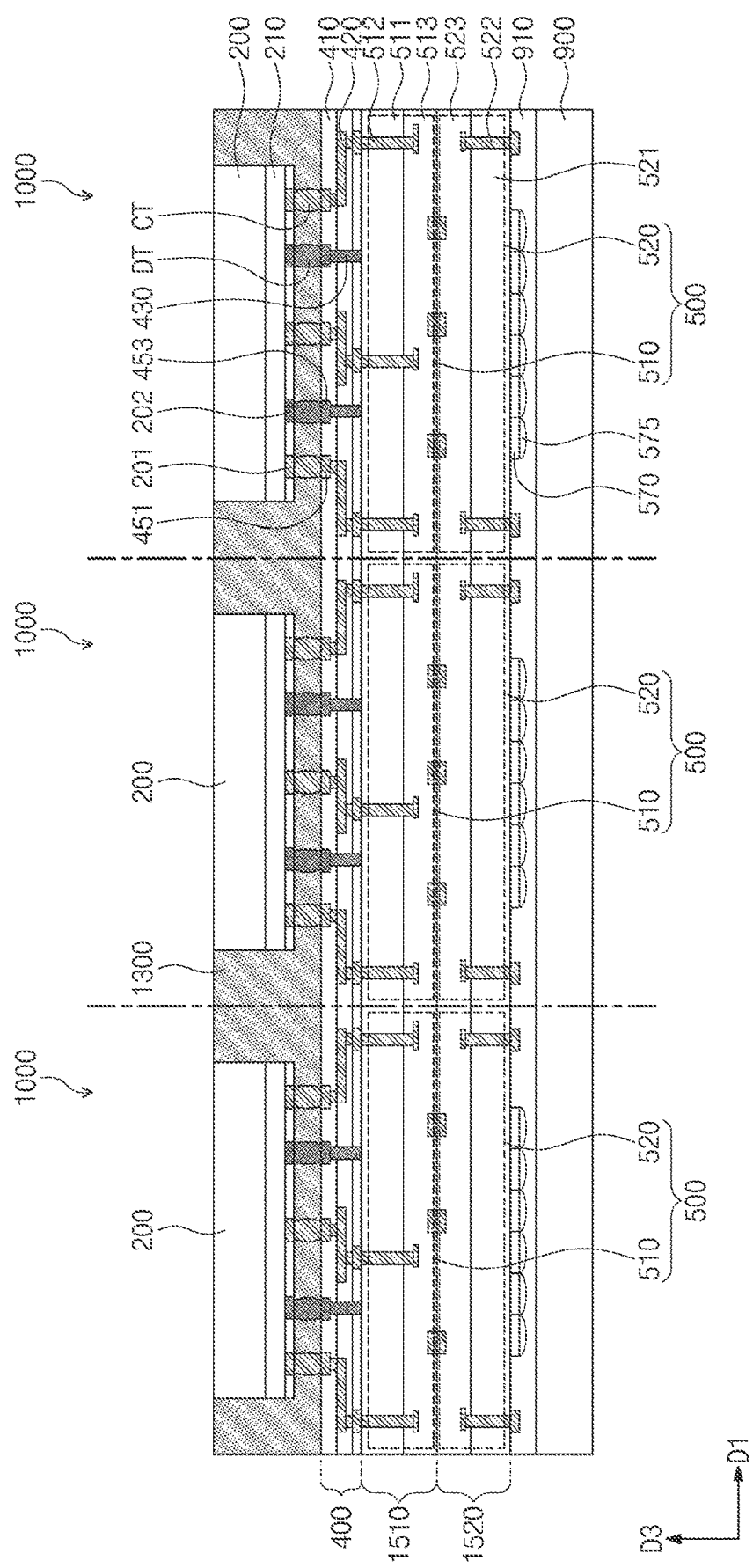

Referring to FIG. 7E, the molding pattern 1300, the logic substrate 1510, and the sensing substrate 1520 may be sawn, as depicted by alternate long and short dash lines. Thus, the chip stacks 1000 may be separated from each other. Here, the molding pattern 1300 may be divided into a plurality of mold layers 300. The logic chips 510 may be divided by the sawing process. Thus, the sensing chips 520 may be separated from each other. Each of the chip stacks 1000 may be the same as the chip stack 1000 of FIG. 6D. For example, each of the chip stacks 1000 may include the memory chip 200, the mold layer 300, and the image sensor chip 500. As a result of the sawing process, the chip stacks 1000 may be separated from each other. Thus, in each of the chip stacks 1000, a width of the mold layer 300 may be substantially the same as those of the re-distribution layer 400 and the image sensor chip 500. Hereinafter, one of the chip stacks 1000 will be described.

Referring back to FIG. 6E, the chip stack 1000 may be turned upside down, and then, the chip stack 1000 may be provided on the substrate 100. The carrier substrate 900 and the carrier adhesive layer 910 may be removed. Thus, the micro lens arrays 575 and the connection pad 590 may be exposed.

Referring back to FIG. 5A, the bonding wire 600 may be formed to be connected to the connection pad 590 and the substrate pad 190.

Figure 8:
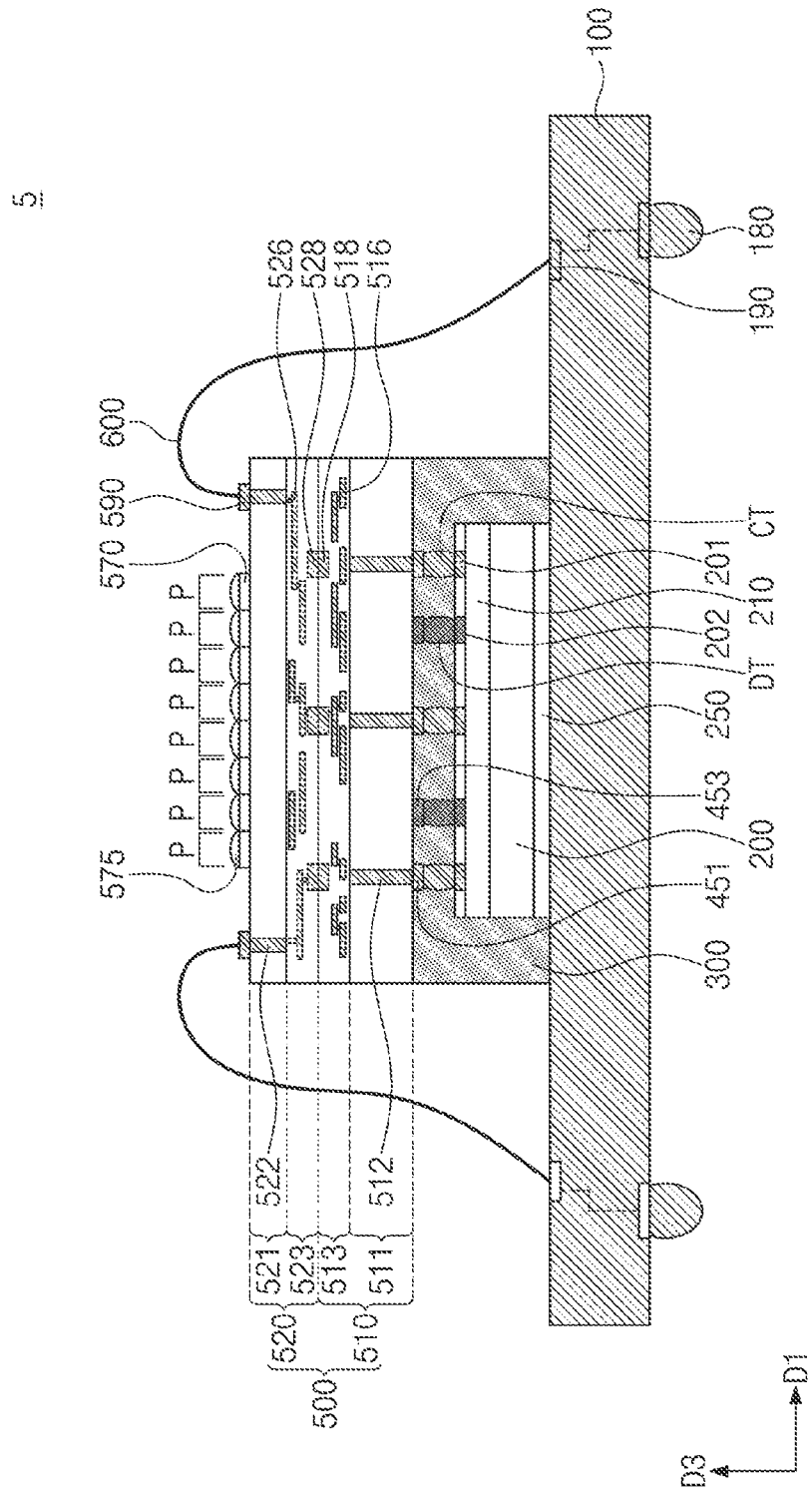
FIG. 8 is a sectional view illustrating a semiconductor package according to an example embodiment of the inventive concepts.

FIG. 8 is a sectional view illustrating a semiconductor package according to an example embodiment of the inventive concepts. For the sake of brevity, again, the elements and features of this example that are the same as or similar to those previously shown and described will not be described in much further detail.

Referring to FIG. 8, a semiconductor package 5 may include the substrate 100, the memory chip 200, the mold layer 300, the connection terminal CT, the dummy terminal DT, and the image sensor chip 500. The re-distribution layer 400 and the second pad 452 may not be provided. The first pad 451 and the third pad 453 may be provided on the first surface 500a of the image sensor chip 500. The connection terminal CT may be interposed between the chip pad 201 and the first pad 451. The first via 512 may be aligned to the first pad 451 in the third direction D3. The first via 512 may be provided at a center region of the logic chip 510. The first via 512 may be electrically connected to the connection terminal CT but may be electrically disconnected from the dummy terminal DT. The memory chip 200 may be electrically connected to the first circuit layer 513 of the logic chip 510 through the first via 512. In some example embodiments, a plurality of first vias 512 may be provided. Some of the first vias 512 may be electrically connected to second via 522 and the bonding wire 600 through the first wire patterns 516 and the second wire patterns 526. Accordingly, the memory chip 200 may be electrically connected to the substrate 100 through some of the first vias 512. The dummy terminal DT may be omitted.

Figure 9:
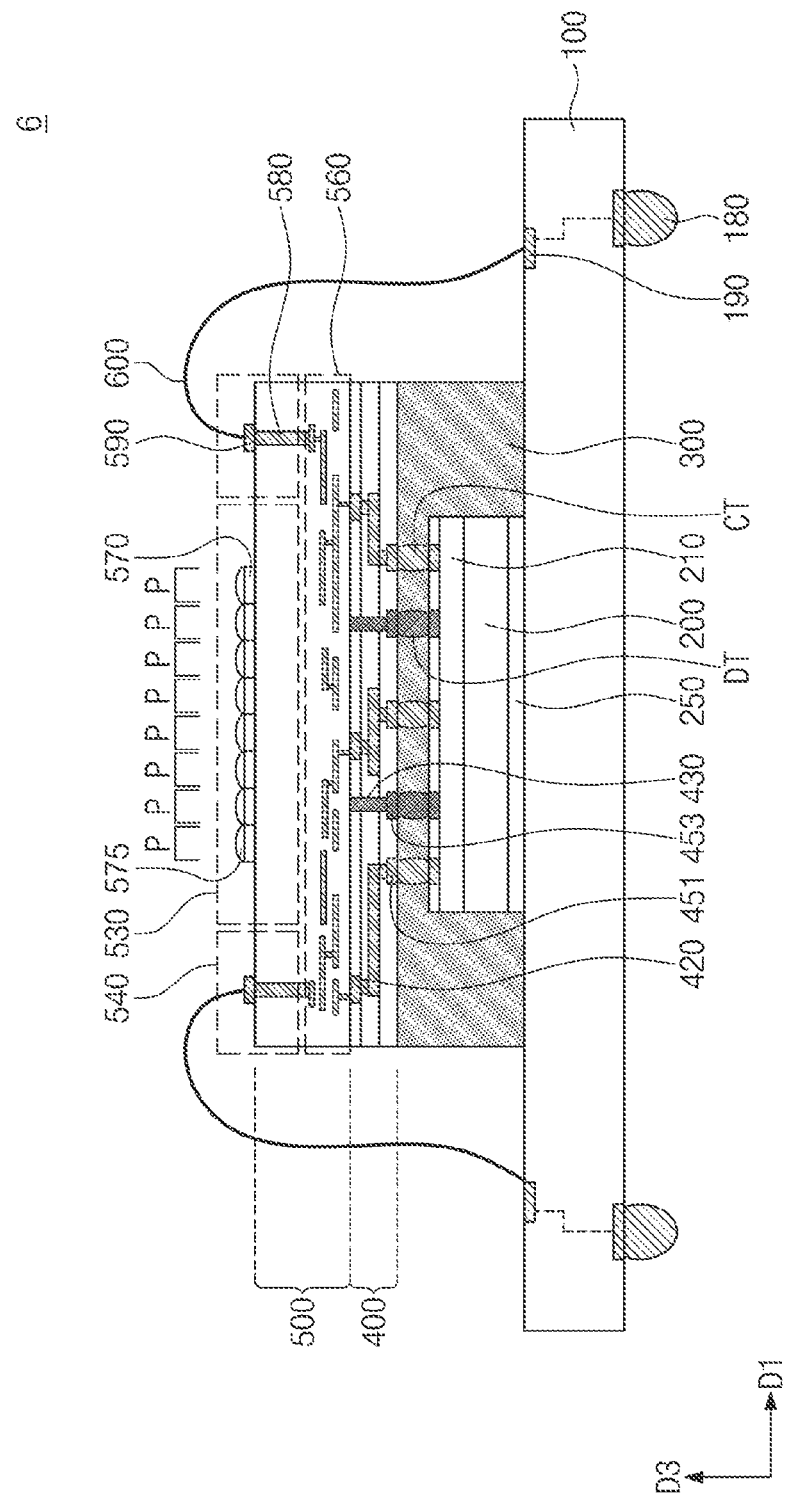
FIG. 9 is a sectional view illustrating a semiconductor package according to an example embodiment of the inventive concepts.

FIG. 9 is a sectional view illustrating a semiconductor package according to an example embodiment of the inventive concepts. For the sake of brevity, the elements and features of this example that are the same as or similar to those previously shown and described will not be described in much further detail.

Referring to FIG. 9, a semiconductor package 6 may include the substrate 100, the memory chip 200, the mold layer 300, the connection terminal CT, the dummy terminal DT, the re-distribution layer 400, and the image sensor chip 500. The image sensor chip 500 may include a sensing unit 530 and a logic unit 540. The sensing unit 530 and the logic unit 540 may be formed in a single semiconductor substrate to fabricate the semiconductor package 6. When viewed in a plan view, the sensing unit 530 may be provided at a center region of the image sensor chip 500. The sensing unit 530 may include the active pixel arrays 10 of FIG. 4. For example, a plurality of the pixels P may be provided on the sensing unit 530. The color filters 570 and the micro lens arrays 575 may be provided on the second surface 500b of the sensing unit 530 of the image sensor chip 500. Although not shown, the sensing unit 530 may include a photoelectric conversion device (e.g., a photo diode). The logic unit 540 may be provided on a peripheral region of the image sensor chip 500, when viewed in a plan view. For example, the logic unit 540 may be provided at a side of the sensing unit 530. However, arrangements of the sensing unit 530 and the logic unit 540 are not limited thereto. The logic unit 540 may include at least one of the row decoder 20, the row driver 30, the column decoder 40, timing generator 50, the CDS 60, the ADC 70, or the I/O buffer 80 described with reference to FIG. 4. An interconnection layer 560 may be provided at a lower portion of the image sensor chip 500. Electrical signals generated in the sensing unit 530 may be transmitted to the logic unit 540 through the interconnection layer 560. A via 580 may be provided to penetrate a portion of the image sensor chip 500 through the second surface 500b and may be electrically connected to the interconnection layer 560 or the integrated circuits in the logic unit 540. The via 580 may be coupled to the connection pad 590.

The memory chip 200 may be electrically connected to the image sensor chip 500 through the connection terminal CT. The memory chip 200 may be electrically connected to the substrate 100 through the connection terminal CT, the interconnection layer 560, the via 580, and the bonding wire 600.

Figure 10A:
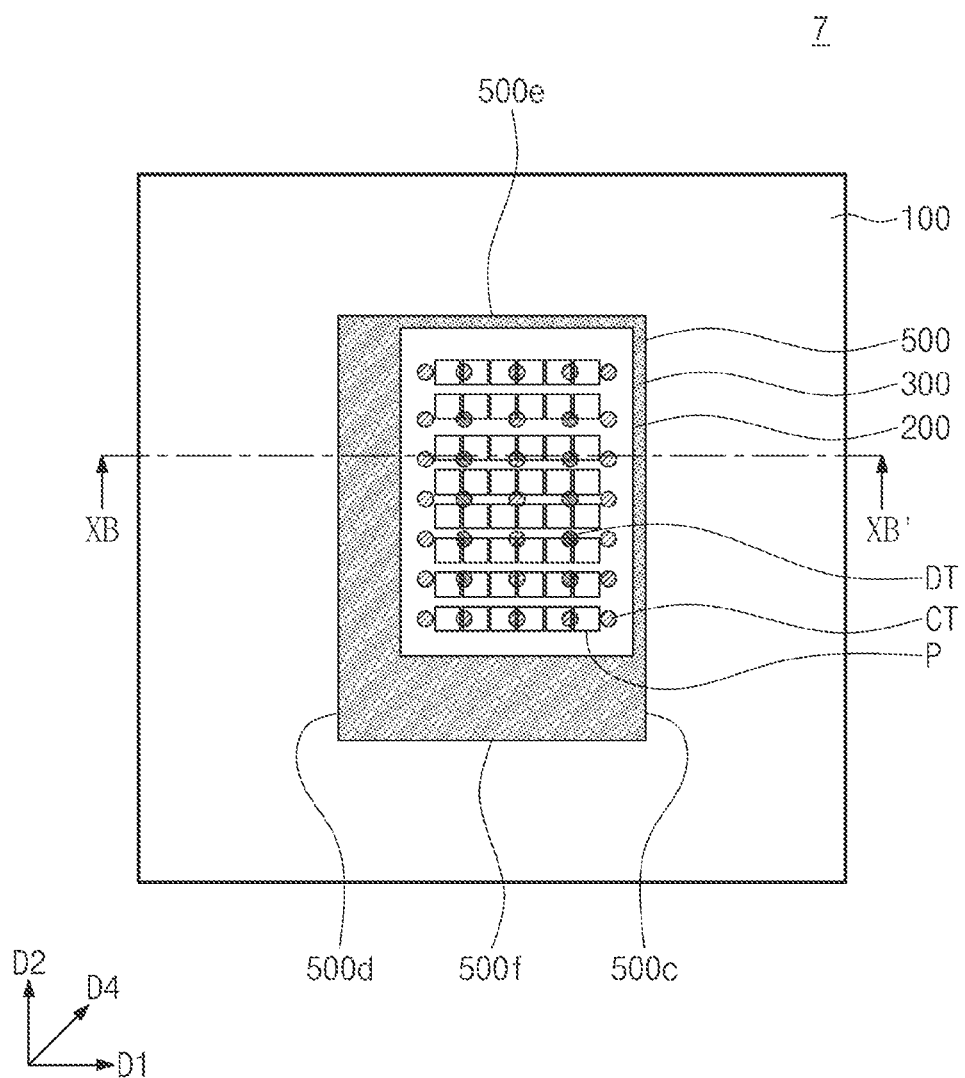
FIG. 10A is a sectional view illustrating a semiconductor package according to an example embodiment of the inventive concepts.
Figure 10B:
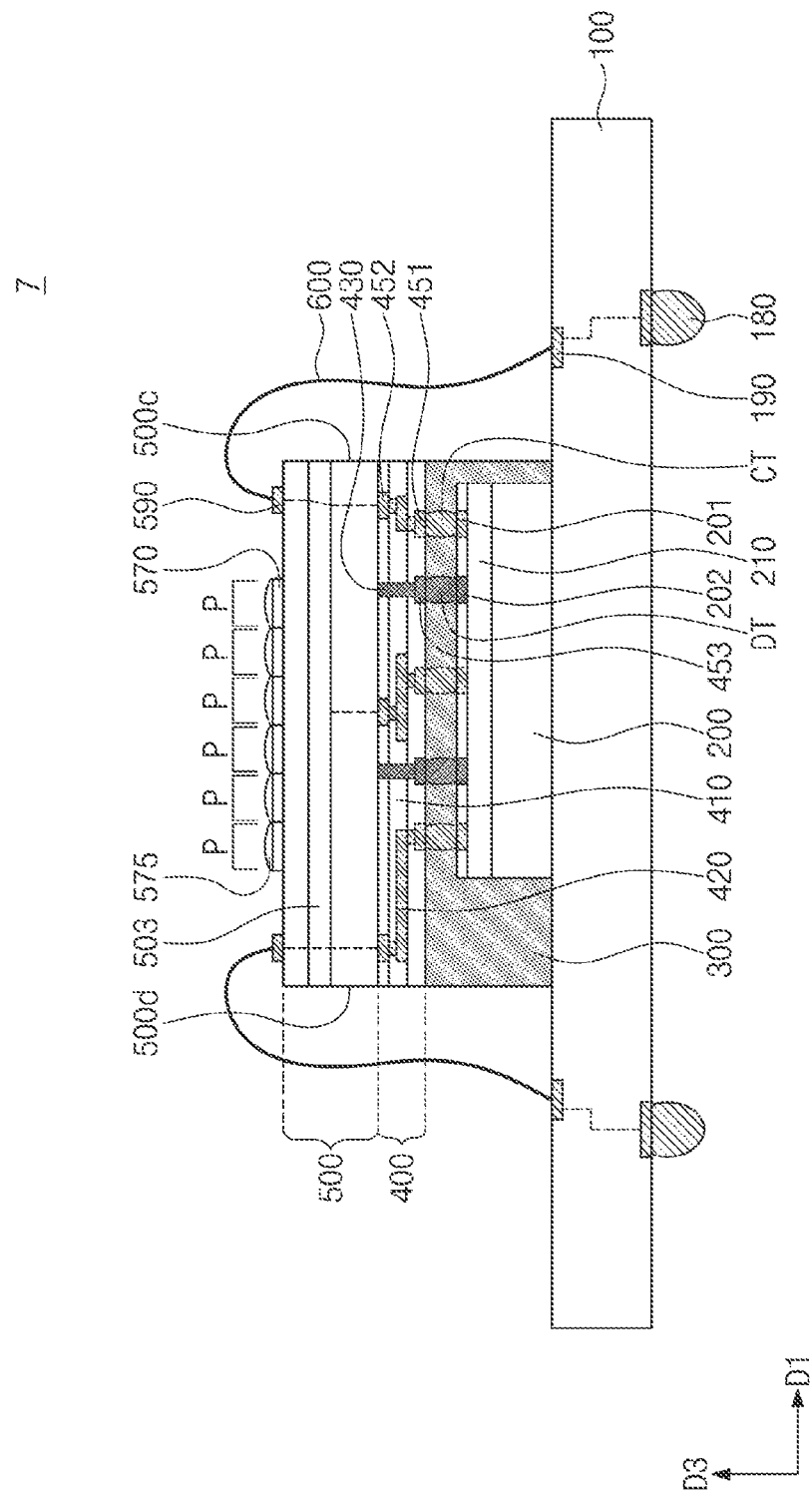
FIG. 10B is a sectional view taken along line XB-XB' of FIG. 10A.

FIG. 10A is a sectional view illustrating a semiconductor package according to an example embodiment of the inventive concepts. FIG. 10B is a sectional view taken along line XB-XB' of FIG. 10A. For the sake of brevity, the elements and features of this example that are the same as or similar to those previously shown and described will not be described in much further detail.

Referring to FIGS. 10A and 10B, a semiconductor package 7 may include the substrate 100, the memory chip 200, the mold layer 300, the connection terminal CT, the dummy terminal DT, the re-distribution layer 400, and the image sensor chip 500. The image sensor chip 500 may have first to fourth sides 500c, 500d, 500e, and 500f. The first side 500c of the image sensor chip 500 may be positioned opposite to the second side 500d. The first side 500c of the image sensor chip 500 may be positioned adjacent to the third side 500e and the fourth side 500f. The fourth side 500f of the image sensor chip 500 may be positioned opposite to the third side 500e.

When viewed in a plan view, the memory chip 200 may have a center axis that is shifted from that of the image sensor chip 500. For example, the center axis of the memory chip 200 may be shifted from that of the image sensor chip 500 in a fourth direction D4. The fourth direction D4 may not be parallel to the first direction D1 and the second direction D2. The memory chip 200 may be closer to the first side 500c of the image sensor chip 500 than to the second side 500d. The memory chip 200 may be closer to the third side 500e of the image sensor chip 500 than to the fourth side 500f. In some example embodiments, the center axis of the memory chip 200 may be shifted from that of the image sensor chip 500 in the first or second direction D1 or D2. In certain example embodiments, the dummy terminal DT or the re-distribution layer 400 may be omitted.

Figure 11A:
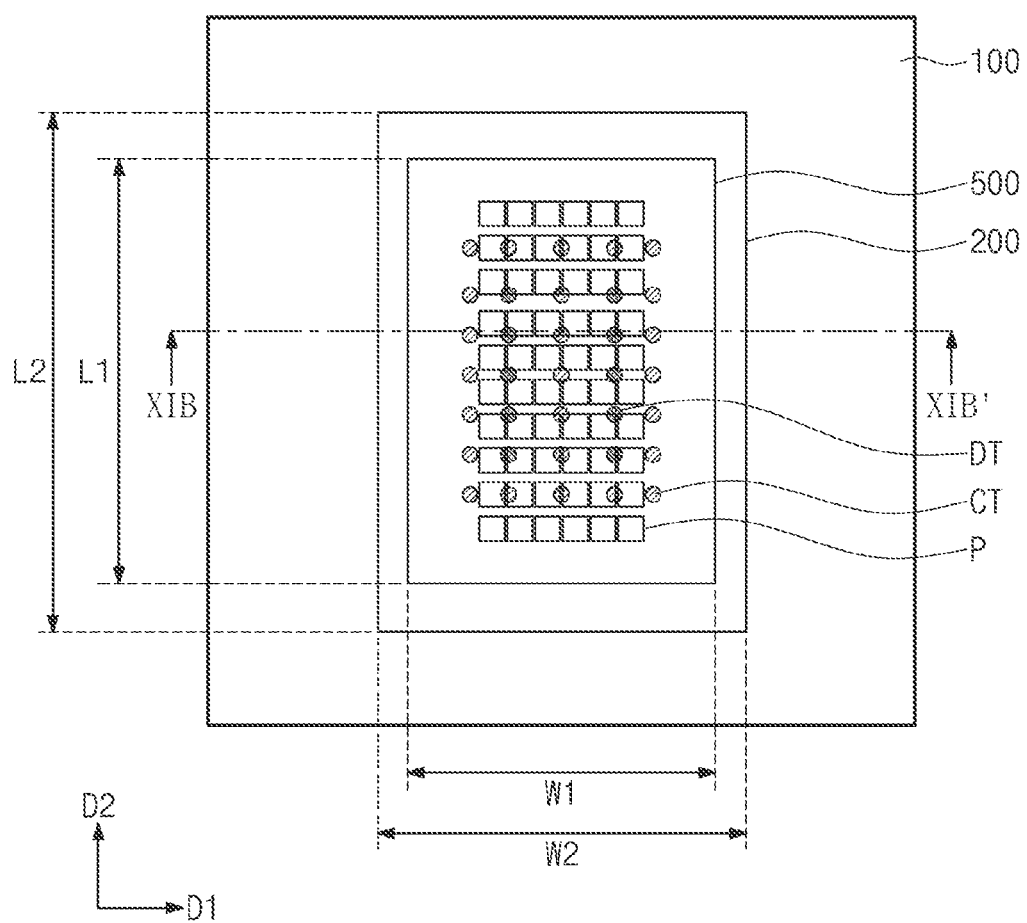
FIG. 11A is a sectional view illustrating a semiconductor package according to an example embodiment of the inventive concepts.
Figure 11B:
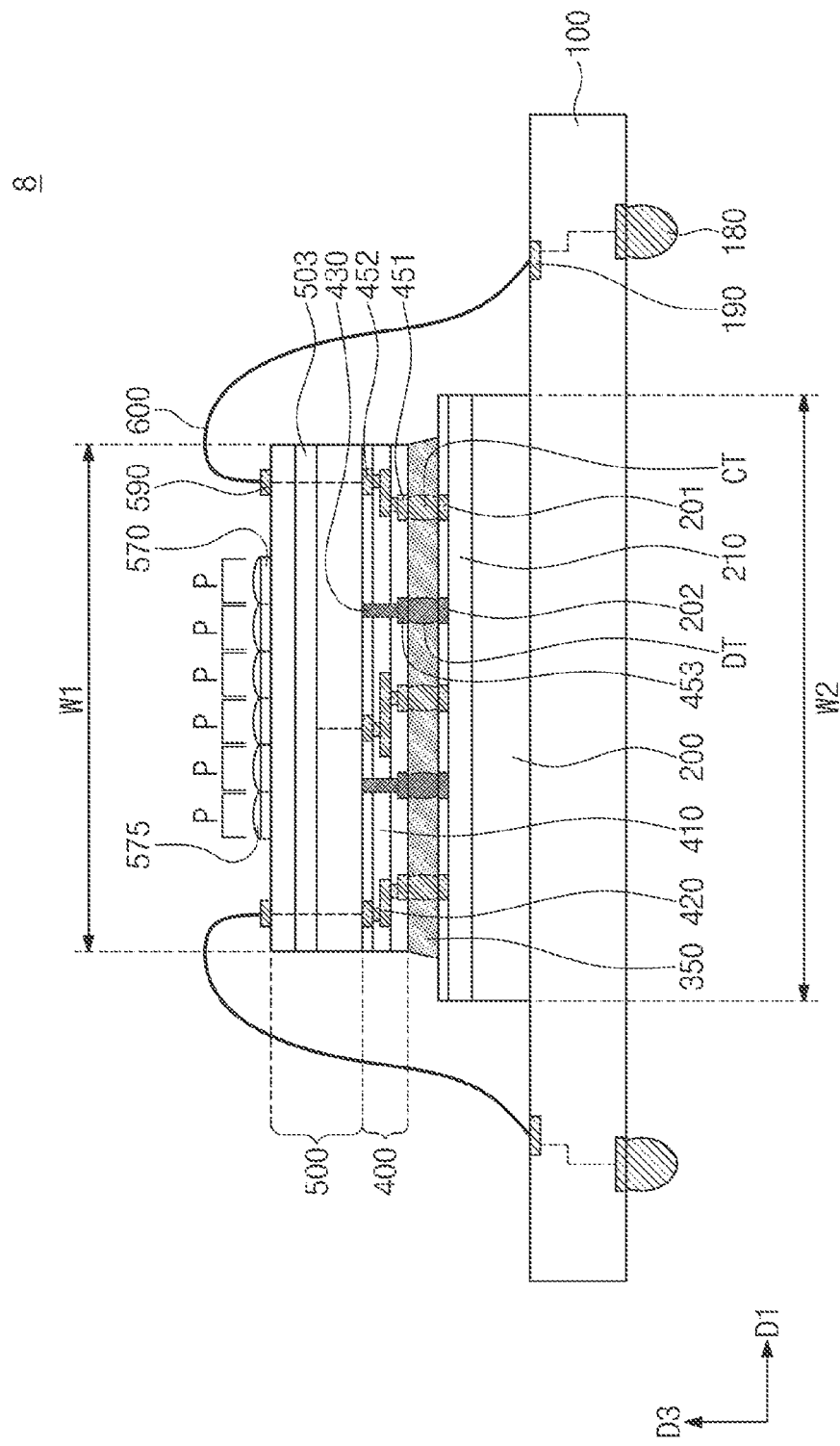
FIG. 11B is a sectional view taken along line XIB-XIB' of FIG. 11A.

FIG. 11A is a sectional view illustrating a semiconductor package according to an example embodiment of the inventive concepts. FIG. 11B is a sectional view taken along line XIB-XIB' of FIG. 11A. For the sake of brevity, the elements and features of this example that are the same as or similar to those previously shown and described will not be described in much further detail.

Referring to FIGS. 11A and 11B, a semiconductor package 8 may include the substrate 100, the memory chip 200, the connection terminal CT, the dummy terminal DT, the re-distribution layer 400, and the image sensor chip 500. The image sensor chip 500 may be provided on the memory chip 200. When viewed in a plan view, a size of the image sensor chip 500 may be smaller than that of the memory chip 200. The width W1 of the image sensor chip 500 may be less than the width W2 of the memory chip 200. The length L1 of the image sensor chip 500 may be less than the length L2 of the image sensor chip 500. The image sensor chip 500 may be electrically connected to the memory chip 200 through the re-distribution pattern 420 and the connection terminal CT. An under fill layer 350 may be provided in a gap region between the memory chip 200 and the re-distribution layer 400. The under fill layer 350 may be provided to hermetically enclose the connection terminal CT and the dummy terminal DT. The image sensor chip 500 may be electrically connected to the substrate 100 through the bonding wire 600.

In certain example embodiments, when viewed in a plan view, the image sensor chip 500 may be provided to have a center axis shifted from that of the memory chip 200. In certain example embodiments, the dummy terminal DT may be omitted.

FIGS. 12A to 12E are sectional views illustrating a method of fabricating a semiconductor package, according to an example embodiment of the inventive concepts. For the sake of brevity, the elements and features of this example that are the same as or similar to those previously shown and described will not be described in much further detail. In the following drawings, wire patterns and integrated devices in a circuit layer are omitted or are briefly illustrated.

Referring to FIG. 12A, the sensing substrate 1520, the logic substrate 1510, and the re-distribution layer 400 may be formed on the carrier substrate 900. The sensing substrate 1520, the logic substrate 1510, and the re-distribution layer 400 may be formed using the same method as illustrated in FIGS. 7A and 7B. Thereafter, the carrier substrate 900 and the carrier adhesive layer 910 may be removed to expose the micro lens arrays 575 and the connection pad 590. A cleaning process may be performed on the sensing substrate 1520 to remove residues of the carrier adhesive layer 910.

Figure 12B:
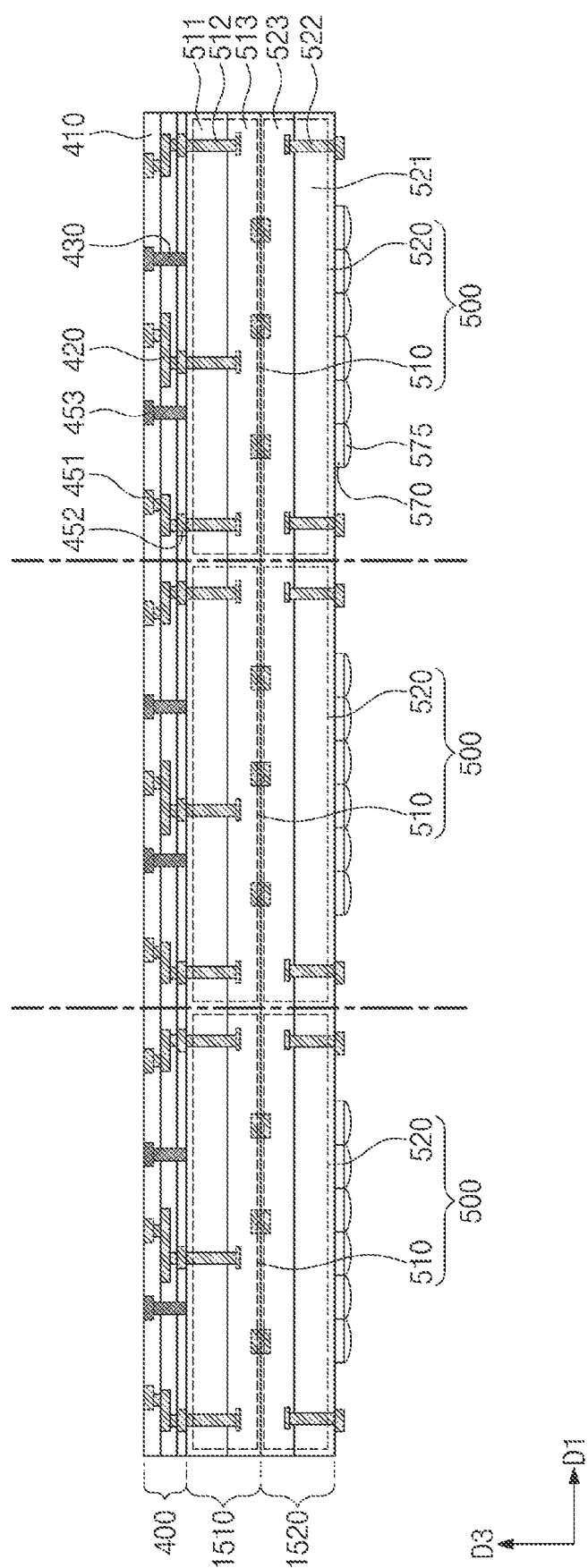

Referring to FIG. 12B, a sawing process may be performed to cut the logic substrate 1510, the sensing substrate 1520, and the re-distribution layer 400 (e.g., along an alternate long and short dash line of FIG. 12B), to separate the image sensor chips 500 from each other. Each of the image sensor chips 500 may include the logic chip 510 and the sensing chip 520.

Figure 12C:
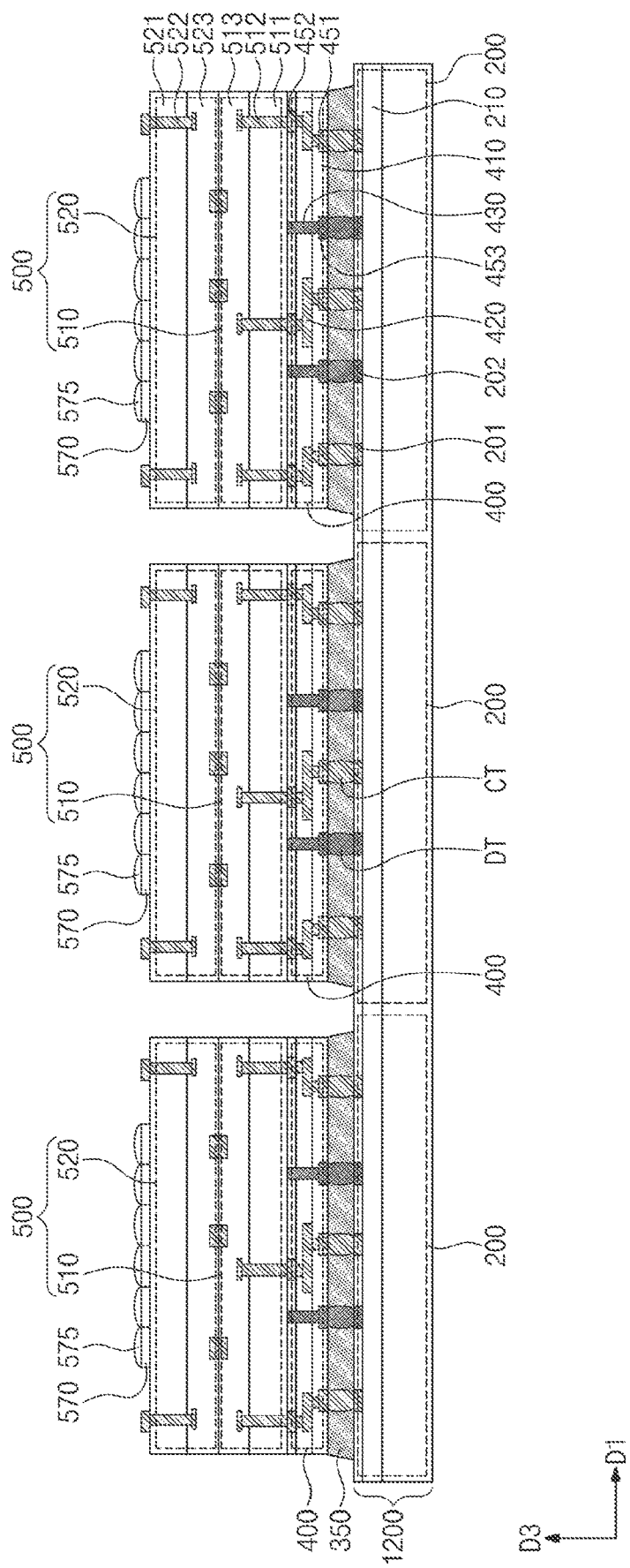

Referring to FIG. 12C, a memory substrate 1200 may be prepared. The memory substrate 1200 may be provided in the form of a wafer. In some example embodiments, a plurality of the memory chips 200 may be provided in the memory substrate 1200. A plurality of image sensor chips 500 may be mounted on the memory substrate 1200 by a chip-on-wafer process. For example, the image sensor chips 500 may be provided on the memory substrate 1200 to be spaced apart from each other. Here, the re-distribution layer 400 may be provided to face the memory substrate 1200. The connection terminals CT and the dummy terminals DT may be formed between the memory substrate 1200 and the re-distribution layer 400 by a reflow process. The image sensor chips 500 may be electrically connected to ones of the memory chips 200 through the connection terminals CT, respectively. The under fill layer 350 may be formed in a gap region between the memory substrate 1200 and the re-distribution layer 400.

Figure 12D:
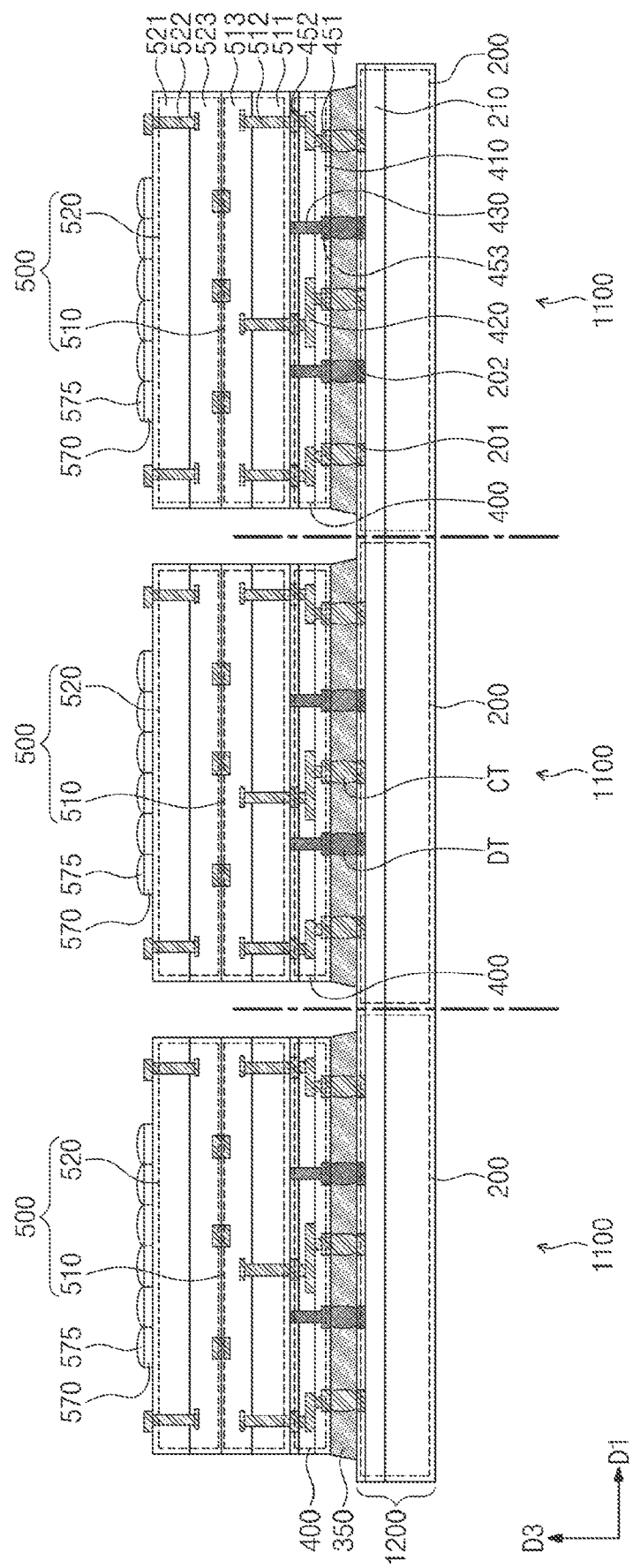

Referring to FIG. 12D, a sawing process may be performed to cut the memory substrate 1200 (for example, along an alternate long and short dash line of FIG. 12D) to separate the memory chips 200 from each other. Accordingly, the chip stacks 1100 may be fabricated. Each of the chip stacks 1100 may include the memory chip 200 and the image sensor chip 500. The image sensor chip 500 may have a width that is less than that of the memory chip 200. Hereinafter, one of the chip stacks 1100 will be described.

Figure 12E:
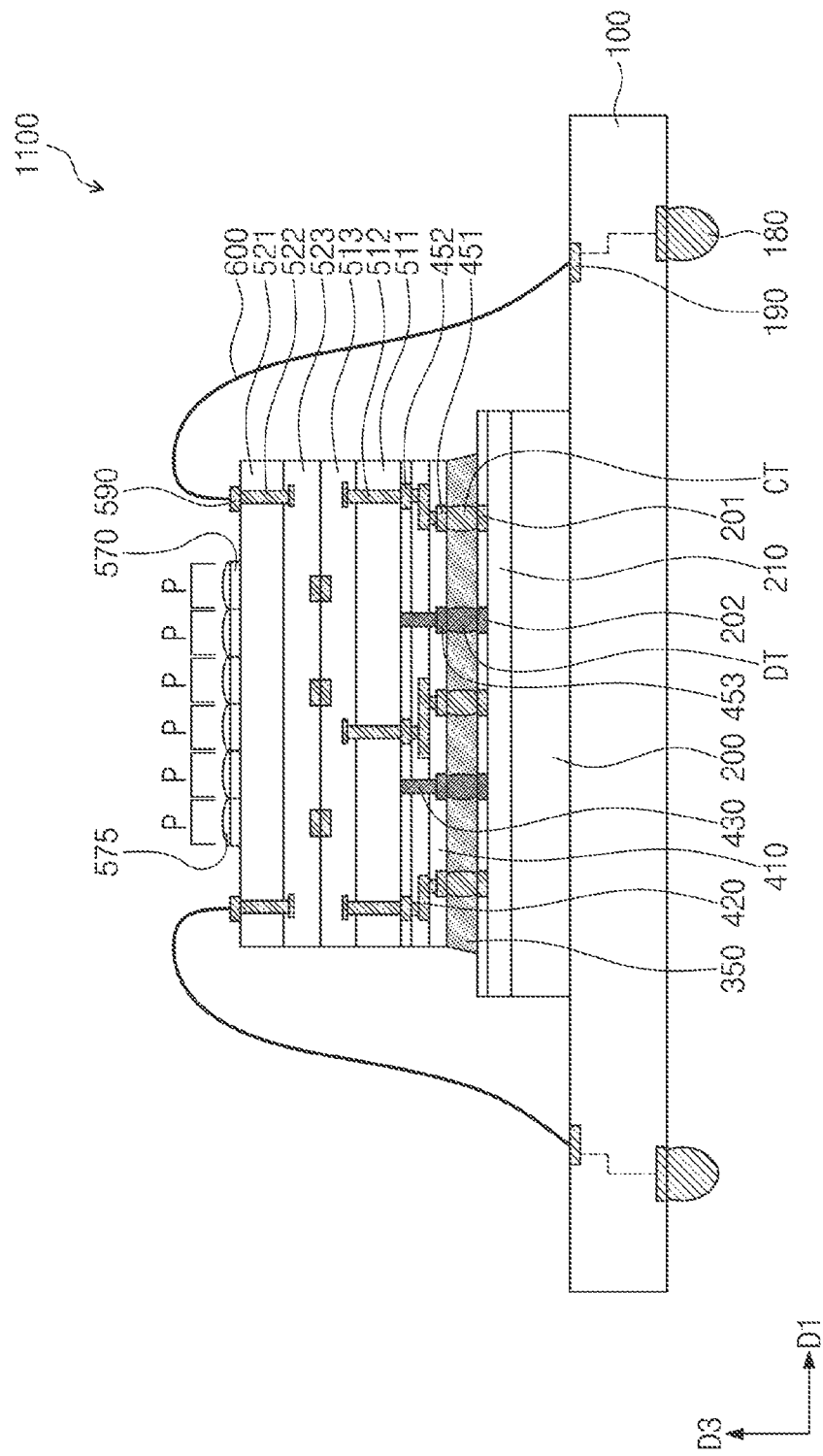

Referring to FIG. 12E, the chip stack 1100 may be turned upside down, and then, the chip stack 1100 may be provided on the substrate 100. The bonding wire 600 may be formed to be connected to the connection pad 590 and the substrate pad 190. Accordingly, the image sensor chip 500 may be electrically connected to the substrate 100.

Figure 13A:
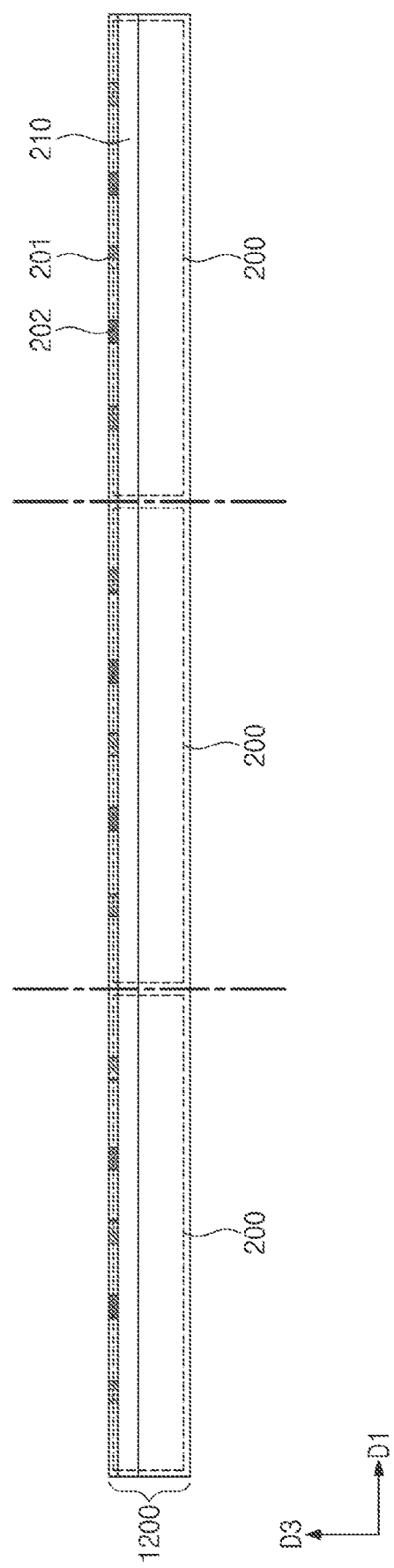
FIGS. 13A and 13B are sectional views illustrating a method of fabricating a chip stack, according to an example embodiment of the inventive concepts.
Figure 13B:
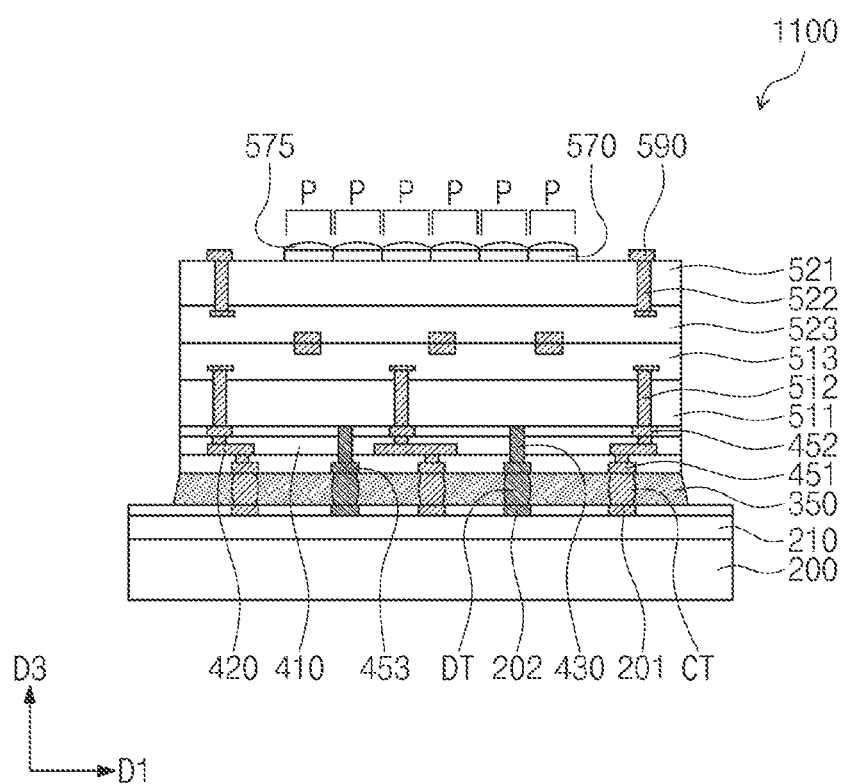

FIGS. 13A and 13B are sectional views illustrating a method of fabricating a chip stack, according to an example embodiment of the inventive concepts. For the sake of brevity, the elements and features of this example that are the same as or similar to those previously shown and described will not be described in much further detail.

Referring to FIG. 13A, the memory substrate 1200 may be prepared. The memory substrate 1200 may include a plurality of memory chips 200. A sawing process may be performed to divide the memory substrate 1200 into a plurality of the memory chips 200.

Referring to FIG. 13B, the image sensor chip 500 may be mounted on the memory chip 200 in a chip-on-chip manner to fabricate the chip stack 1100. The image sensor chip 500 may be fabricated using the same method as or substantially similar method to the methods illustrated in FIGS. 7A and 7B. However, methods of fabricating the image sensor chip 500 are not limited thereto. The connection terminals CT and the dummy terminals DT may be formed between the memory chip 200 and the re-distribution pattern 420. The under fill layer 350 may hermetically seal the connection terminals CT and the dummy terminals DT.

According to some example embodiments of the inventive concepts, a memory chip may be electrically connected to an image sensor chip through a connection terminal. For example, the connection terminal may be provided between the memory chip and the image sensor chip, thereby reducing a length of a connection path between the memory chip and the image sensor chip. Accordingly, image distortion may be mitigated or prevented from occurring in a semiconductor package. The connection terminal may be formed by a reflow process to be performed at a relatively low temperature. Thus, the image sensor chip and/or the memory chip may be suppressed or prevented from being damaged during a process of forming the connection terminal.

A mold layer may be provided on a side surface of the memory chip and may be used to support the image sensor chip. Accordingly, the image sensor chip can be stably disposed on the memory chip and the mold layer.

While some example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor package, comprising:
preparing an image sensor chip having a first surface and a second surface, the first surface and the second surface being opposite to each other, the image sensor chip including pixel regions positioned on the second surface of the image sensor chip;
mounting a memory chip on the first surface of the image sensor chip such that the memory chip is electrically connected to the image sensor chip through a connection terminal formed between the first surface of the image sensor chip and a third surface of the memory chip that faces the first surface of the image sensor chip; and
forming a mold layer on the first surface of the image sensor chip to cover a first side surface of the memory chip to form a chip stack, and to not cover a fourth surface of the memory chip, the fourth surface being opposite to the third surface,
wherein the mold layer has a thermal conductivity that is lower than that of a substrate on which the chip stack provided, and
an outer side surface of the mold layer is aligned with a second side surface of the image sensor chip.

2. The method of claim 1, further comprising:
preparing the substrate;
providing the chip stack on the substrate such that the fourth surface of the memory chip faces the substrate; and
forming a bonding wire to electrically connect the image sensor chip to the substrate.

3. The method of claim 1, wherein the image sensor chip has a width that is larger than that of the memory chip and is substantially same as that of the mold layer.

4. The method of claim 1, further comprising:
forming a re-distribution pattern on the first surface of the image sensor chip to electrically connect a circuit layer of the image sensor chip to the connection terminal.

5. The method of claim 1, further comprising:
forming a dummy terminal between the memory chip and the image sensor chip such that the dummy terminal overlaps the pixel regions, when viewed in a plan view.

6. The method of claim 1, wherein the memory chip has the third surface facing the image sensor chip and the fourth surface, and
the fourth surface of the memory chip is exposed by the mold layer.

7. The method of claim 1, wherein the forming a mold layer includes forming the mold layer such that an inner side surface of the mold layer is in contact with the first side surface of the memory chip.

8. The method of claim 1, wherein the forming a mold layer includes forming the mold layer such that the mold layer is on the third surface of the memory chip.

9. The method of claim 4, wherein the forming a re-distribution pattern includes,
forming one or more insulating layers,
forming one or more conductive layers between the one or more insulating layers, and
forming one or more conductive vias penetrating at least one of the one or more insulating layers and to be coupled to a corresponding one of the one or more conductive layers.

10. The method of claim 1, further comprising:
forming a first pad on the first surface of the image sensor chip;
forming a re-distribution pattern between the image sensor chip and the memory chip to cover the first pad; and
forming a second pad on a fifth surface of the re-distribution pattern to face and couple with the connection terminal and to be electrically connected to the first pad through the re-distribution pattern, the fifth surface of the re-distribution pattern being a surface facing the memory chip.

11. The method of claim 10, wherein the forming a second pad forms the second pad laterally outside the memory chip.

12. The method of claim 10, wherein the forming a first pad and the forming a second pad form the first and second pads such that the first pad is not aligned to the second pad in a direction perpendicular to the first surface.

13. The method of claim 4, further comprising:
forming a dummy terminal between the memory chip and the image sensor chip and on the re-distribution pattern such that the dummy terminal overlaps the pixel regions, when viewed in a plan view.

14. The method of claim 13, wherein the dummy terminal includes a conductive material, and is electrically disconnected from integrated devices in the memory chip and the re-distribution pattern.

15. The method of claim 13, wherein the forming a dummy terminal includes forming the connection terminal and the dummy terminal simultaneously and to be separated from each other.

16. The method of claim 5, wherein the dummy terminal includes a thermally conductive material and provides a thermal connection between the memory chip and the image sensor chip.

17. The method of claim 16, further comprising:
forming a redistribution layer, which includes insulating layers and a re-distribution pattern, on the first surface of the image sensor chip such that the re-distribution pattern is provided between and penetrating through the insulating layers and is electrically connected to a circuit layer of the image sensor chip and the connection terminal.

18. The method of claim 17, further comprising:
forming a metal pattern penetrating the insulating layers to be separated from the re-distribution pattern, to physically contact the image sensor chip, and to be thermally coupled with the dummy terminal.

* * * * *